(12) United States Patent
Yokoyama et al.

(10) Patent No.: US 11,996,130 B2
(45) Date of Patent: May 28, 2024

(54) NONVOLATILE MEMORY CELL, NONVOLATILE MEMORY CELL ARRAY, AND INFORMATION WRITING METHOD OF NONVOLATILE MEMORY CELL ARRAY

(71) Applicant: Sony Semiconductor Solutions Corporation, Kanagawa (JP)

(72) Inventors: Takashi Yokoyama, Kanagawa (JP); Mikio Oka, Kanagawa (JP); Yasuo Kanda, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 187 days.

(21) Appl. No.: 17/627,839

(22) PCT Filed: Jun. 11, 2020

(86) PCT No.: PCT/JP2020/023048
§ 371 (c)(1),
(2) Date: Jan. 18, 2022

(87) PCT Pub. No.: WO2021/014810
PCT Pub. Date: Jan. 28, 2021

(65) Prior Publication Data
US 2022/0262420 A1    Aug. 18, 2022

(30) Foreign Application Priority Data
Jul. 24, 2019 (JP) ................................ 2019-135920

(51) Int. Cl.
*G11C 11/16* (2006.01)
(52) U.S. Cl.
CPC ...... *G11C 11/1675* (2013.01); *G11C 11/1655* (2013.01); *G11C 11/1657* (2013.01); *G11C 11/1673* (2013.01)

(58) Field of Classification Search
CPC ............ G11C 11/1675; G11C 11/1655; G11C 11/1657; G11C 11/1673
(Continued)

(56) References Cited

U.S. PATENT DOCUMENTS

2011/0267874 A1* 11/2011 Ryu .................... G11C 11/1675
365/158
2012/0008367 A1   1/2012 Kajiyama
(Continued)

FOREIGN PATENT DOCUMENTS

JP    2007-123512 A    5/2007
JP    2012-019105 A    1/2012
(Continued)

OTHER PUBLICATIONS

International Search Report issued in International Patent Application No. PCT/JP2020/023048 dated Sep. 1, 2020 and English translation of same. 5 pages.
(Continued)

*Primary Examiner* — Huan Hoang
(74) *Attorney, Agent, or Firm* — K&L Gates LLP

(57) ABSTRACT

A nonvolatile memory cell includes a resistance-change nonvolatile memory element 50 and a selection transistor TR. One end of the nonvolatile memory element 50 is connected to one source/drain region 15A of the selection transistor TR and is connected to a write line WR. The other source/drain region 15B of the selection transistor TR is connected to a select line SL. The other end of the nonvolatile memory element 50 is connected to a bit line BL.

16 Claims, 20 Drawing Sheets

(58) Field of Classification Search
USPC .............................................. 365/225.5, 158
See application file for complete search history.

(56) References Cited

U.S. PATENT DOCUMENTS

2019/0147931 A1   5/2019   Oka et al.
2019/0172513 A1   6/2019   Kariyada

FOREIGN PATENT DOCUMENTS

| JP | 2014-220376 A1 | 11/2014 | |
|---|---|---|---|
| JP | 2017-199443 A | 11/2017 | |
| WO | WO-2016042880 A1 * | 3/2016 | ........... H01L 27/228 |
| WO | WO2018/037777 A1 | 3/2018 | |

OTHER PUBLICATIONS

Written Opinion issued in International Patent Application No. PCT/JP2020/023048 dated Sep. 1, 2020. 4 pages.

* cited by examiner

NONVOLATILE MEMORY CELL, NONVOLATILE MEMORY CELL ARRAY, AND INFORMATION WRITING METHOD OF NONVOLATILE MEMORY CELL ARRAY

FIELD

The present disclosure relates to a nonvolatile memory cell, a nonvolatile memory cell array including the nonvolatile memory cell, and an information writing method of the nonvolatile memory cell array.

BACKGROUND

Current writing-type magnetic random access memory (MRAM) elements having features of being nonvolatile and being accessible at a high speed are increasingly important as substituent elements for an SRAM element in cache memories or the like, particularly in state-of-the-art logic circuits after a 20-nm node in which a leakage current during standby of the SRAM element is an issue. Regarding the memory elements, it is also important how many memory elements can be mounted and how much the capacity can be increased, and thus, area reduction per unit memory cell is also an important issue. Thus, as such memory elements, memory elements of a magnetization reversal type have been studied, and particularly a nonvolatile memory element including a spin transfer torque-based magnetic random access memory (STT-MRAM) to which magnetization reversal by spin injection is applied has attracted attention (for example, see JP 2014-220376 A).

The magnetization reversal by spin injection is a phenomenon in which electrons that have been spin-polarized by passing through a magnetic body are injected into the other magnetic body, thereby causing magnetization reversal in the other magnetic body. Since the spin transfer torque-based magnetic random access memory uses the magnetization reversal by spin injection, and thus, has an advantage that a write current does not increase even when the memory is miniaturized, an advantage that scaling is possible since a write current value decreases in proportion to the memory volume, an advantage that a cell area can be reduced, and an advantage that a device structure and a cell structure are simplified.

FIG. 19 illustrates an equivalent circuit diagram of a conventional nonvolatile memory cell including a nonvolatile memory element 50 formed of a spin transfer torque-based magnetic random access memory as a two-terminal element, and a selection transistor TR as a three-terminal element provided with a gate electrode and source/drain regions. The spin transfer torque-based magnetic random access memory formed of, for example, a magnetic tunnel junction element (MTJ element), and includes at least two magnetic layers (specifically, a storage layer, an intermediate layer, and a magnetization fixed layer). In the magnetization fixed layer, a magnetization direction is fixed. On the other hand, in the storage layer (free layer), a magnetization direction changes, and information "1" or "0" is stored depending on the magnetization direction. One end of the spin transfer torque-based magnetic random access memory is connected to one of the source/drain regions of the selection transistor TR, and the other end is connected to a bit line BL. In addition, the other source/drain region of the selection transistor TR is connected to a select line SL. Thus, a current is caused to flow from the bit line BL to the select line SL or a current is caused to flow from the select line SL to the bit line BL such that the magnetization direction of the storage layer is reversed by spin injection according to a direction of the current flow, thereby storing information.

In such a spin transfer torque-based magnetic random access memory using the magnetization reversal by spin transfer, a voltage and a current applied to the spin transfer torque-based magnetic random access memory at the time of writing information are determined by the driving capability of the selection transistor TR. Meanwhile, a drive current of the selection transistor TR has asymmetry such as a difference in flowing current value between a case where the current flows from the one source/drain region to the other source/drain region and a case where the current flows from the other source/drain region to the one source/drain region.

FIG. 20A illustrates an equivalent circuit diagram in "Writing-1" in which a current flows from the select line SL to the bit line BL via the selection transistor TR and the spin transfer torque-based magnetic random access memory. In addition, FIG. 20B illustrates an equivalent circuit diagram in "Writing-0" in which a current flows from the bit line BL to the select line SL via the spin transfer torque-based magnetic random access memory and the selection transistor TR. Note that the one source/drain region is represented by "one S/D region", and the other source/drain region is represented by "other S/D region" in FIGS. 20A and 20B.

In the example illustrated in FIG. 20A, $V_{dd}$ is applied to the select line SL, and the bit line BL is grounded. On the other hand, in the example illustrated in FIG. 20B, $V_{dd}$ is applied to the bit line BL, and the select line SL is grounded. Thus, in both the cases of writing, the power supply voltage $V_{dd}$ is applied to the gate electrode of the selection transistor TR to bring the selection transistor TR into a conductive state, and a current flows through the spin transfer torque-based magnetic random access memory via the selection transistor TR. At this time, a direction of the current changes depending on whether the power supply voltage $V_{dd}$ is applied to the select line SL or the bit line BL, so that desired information can be written in the spin transfer torque-based magnetic random access memory.

Here, a gate potential is fixed to $V_{dd}$. Thus, in the case of "Writing-1", a potential of the one source/drain region has a value between $V_{dd}$ and $V_{GND}$, specifically, $\Delta V$ due to a voltage drop ($\Delta V$) in the spin transfer torque-based magnetic random access memory. Therefore, a potential difference $\Delta V_0$ between the gate electrode and the one source/drain region becomes ($V_{dd}$-$\Delta V$). On the other hand, in the case of "Writing-0", a potential of the other source/drain region is fixed to $V_{GND}$, and a potential difference $\Delta V_1$ between the gate electrode and the other source/drain region becomes $V_{dd}$.

CITATION LIST

Patent Literature

Patent Literature 1: JP 2014-220376 A

SUMMARY

Technical Problem

As described above, comparing the case of "Writing-0" with the case of "Writing-1", $|\Delta V_0|<|\Delta V_1|$, and the potential difference determining a drive current is smaller in the case of "Writing-1", and as a result, the drive current decreases. That is, the amount of current flowing through the spin transfer torque-based magnetic random access memory is smaller in writing of information in "Writing-1" than in writing of information in the case of "Writing-0", which is disadvantageous. In this manner, the driving capability of the selection transistor TR changes depending on information to be written in writing of information in the conventional spin transfer torque-based magnetic random access memory. Thus, it is necessary to increase the selection transistor TR in order to ensure an appropriate write current even in the disadvantageous case (that is, the case of "Writing-1"), so that there is a problem that a cell area increases. Note that such a problem is not a problem inherent to the spin transfer torque-based magnetic random access memory, but is a problem that can occur in various types of resistance-change nonvolatile memory elements.

Therefore, an object of the present disclosure is to provide a nonvolatile memory cell having a configuration and a structure that enable information writing by causing a current to flow in a single direction without causing a current to flow bidirectionally in a selection transistor, a nonvolatile memory cell array including the nonvolatile memory cell, and an information writing method of the nonvolatile memory cell array.

Solution to Problem

To solve the problems described above, a nonvolatile memory cell according to the present disclosure includes a resistance-change nonvolatile memory element and a selection transistor, wherein one end of the nonvolatile memory element is connected to one source/drain region of the selection transistor and is connected to a write line, other source/drain region of the selection transistor is connected to a select line, and another end of the nonvolatile memory element is connected to a bit line.

To solve the problems described above, a nonvolatile memory cell array according to the present disclosure includes a plurality of nonvolatile memory cells arranged in a two-dimensional matrix in a first direction and a second direction different from the first direction, wherein each of the plurality of nonvolatile memory cells arranged along the first direction includes a resistance-change nonvolatile memory element and a selection transistor, one end of the nonvolatile memory element is connected to one source/drain region of the selection transistor and is connected to a write line common to the plurality of nonvolatile memory cells arranged along the first direction, other source/drain region of the selection transistor is connected to a select line common to the plurality of nonvolatile memory cells arranged along the first direction, and another end of the nonvolatile memory element is connected to a bit line common to the plurality of nonvolatile memory cells arranged along the first direction.

To solve the problems described above, an information writing method of a nonvolatile memory cell array according to the present disclosure is the information writing method of the nonvolatile memory cell array including steps of bringing the selection transistor into a non-conductive state and causing a current to flow between the write line and the nonvolatile memory element to store information "1" in each of the nonvolatile memory cells, in each of the plurality of nonvolatile memory cells arranged along the first direction; and bringing the write line into a floating state, bringing a desired selection transistor into a conductive state, and causing a current to flow between the select line and the nonvolatile memory element via other source/drain region and one source/drain region of the desired selection transistor to store information "0" in the nonvolatile memory cell.

DESCRIPTION OF EMBODIMENTS

Figure 1:
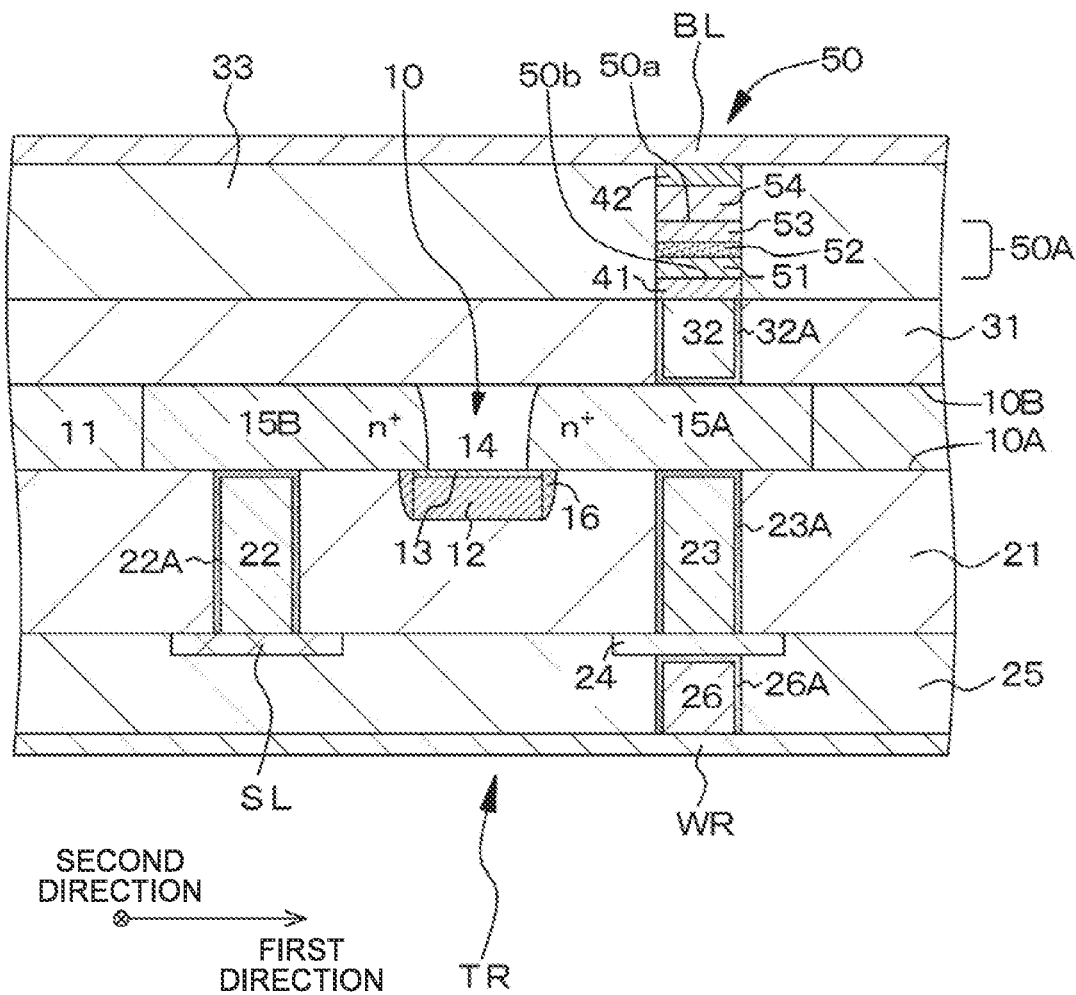
FIG. 1 is a schematic partial cross-sectional view of a nonvolatile memory cell of a first embodiment.

Hereinafter, the present disclosure will be described based on embodiments with reference to the drawings, but the present disclosure is not limited to the embodiments, and various numerical values and materials in the embodiments are examples. Note that the description will be given in the following order.

1. General description of nonvolatile memory cell, nonvolatile memory cell array, and information writing method of nonvolatile memory cell array of present disclosure
2. First embodiment (nonvolatile memory cell, nonvolatile memory cell array, and information writing method of nonvolatile memory cell array)
3. Second embodiment (modification of first embodiment)
4. Third embodiment (modification of second embodiment)
5. Fourth embodiment (modification of first to third embodiments)
6. Fifth embodiment (modification of first to fourth embodiments)
7. Other <General Description of Nonvolatile Memory Cell, Nonvolatile Memory Cell Array, and Information Writing Method of Nonvolatile Memory Cell Array of Present Disclosure>

In a nonvolatile memory cell array of the present disclosure or in a nonvolatile memory cell array in an information writing method of the nonvolatile memory cell array of the present disclosure, a gate electrode of a selection transistor may adopt a mode of being connected to (or also serving as) a word line extending in a second direction.

In a nonvolatile memory cell of the present disclosure, a nonvolatile memory cell forming the nonvolatile memory cell array of the present disclosure including the above-described preferable mode, and a nonvolatile memory cell in the information writing method of the nonvolatile memory cell array of the present disclosure including the above-described preferable mode (hereinafter, these nonvolatile memory cells are collectively referred to as the "nonvolatile memory cell of the present disclosure and the like" for convenience), a nonvolatile memory element can adopt a mode of being formed of a spin transfer torque-based magnetic random access memory of a perpendicular magnetization type. Thus, in this case, it is possible to adopt a mode in which the nonvolatile memory element includes at least a storage layer and a magnetization fixed layer and the magnetization fixed layer is connected to one source/drain region of the selection transistor.

In the nonvolatile memory cell of the present disclosure and the like including the above-described preferable mode, it is possible to adopt a mode in which the selection transistor and a write line are provided on a first surface side of a base portion made of a semiconductor material and the nonvolatile memory element is provided on a second surface side opposing the first surface of the base portion, or a mode in which the selection transistor and the nonvolatile memory element are provided on a first surface side of a base portion made of a semiconductor material and a write line is provided on a second surface side opposing the first surface of the base portion.

In the nonvolatile memory cell of the present disclosure and the like including the various preferable modes described above, it is possible to adopt a configuration in which the one source/drain region of the selection transistor has a rectification property, a current flows between the write line and the nonvolatile memory element via the one source/drain region of the selection transistor when the selection transistor is not conductive, and a current flows between the select line and the nonvolatile memory element via the one source/drain region and the other source/drain region of the selection transistor and a current does not flow (or substantially does not flow) to the write line (or generation of a leakage current to the write line can be suppressed) when the selection transistor is conductive, specifically, a configuration in which only the current of, for example, $1 \times 10^{-12}$ amperes or less flows to the write line although not limited.

Thus, in such a configuration, it is possible to adopt a mode in which the one source/drain region of the selection transistor has a p/n junction. In this case, it is possible to adopt a mode in which the one source/drain region of the selection transistor has a layered structure of a first layer made of silicon (Si) containing an impurity of a first conductivity type and a second layer made of silicon (Si) containing an impurity of a second conductivity type different from the first conductivity type. Note that the nonvolatile memory cell of such a mode may be referred to as a "nonvolatile memory cell of a first mode". Alternatively, it is possible to adopt a mode in which the one source/drain region of the selection transistor has a layered structure of a first layer made of silicon (Si) containing an impurity of a first conductivity type and a second layer made of germanium (Ge) or silicon-germanium (Si—Ge) containing an impurity of a second conductivity type different from the first conductivity type. Note that the nonvolatile memory cell of such a mode may be referred to as a "nonvolatile memory cell of a second mode".

Alternatively, in such a configuration, it is possible to adopt a mode in which the one source/drain region of the selection transistor has a Schottky junction. In this case, it is possible to adopt a mode in which the one source/drain region of the selection transistor has a layered structure of a first layer made of silicon (Si) containing an impurity and a second layer made of metal. Note that the nonvolatile memory cell of such a mode may be referred to as a "nonvolatile memory cell of a third mode". Alternatively, it is possible to adopt a mode in which the one source/drain region of the selection transistor has a layered structure of a first layer made of silicon (Si) containing an impurity and a second layer made of germanium (Ge) or silicon-germanium (Si—Ge) containing an impurity. Note that the nonvolatile memory cell of such a mode may be referred to as a "nonvolatile memory cell of a fourth mode".

In the nonvolatile memory cell of the first mode, the nonvolatile memory cell of the second mode, the nonvolatile memory cell of the third mode, and the nonvolatile memory cell of the fourth mode, the first layer is connected to the nonvolatile memory element, and the second layer is connected to the write line.

Further, in the nonvolatile memory cell of the present disclosure and the like including the various preferable modes and configurations described above, it is possible to adopt a mode in which the selection transistor is formed of a planar transistor, specifically, a field effect transistor (known MIS-FET or MOS-FET), or it is possible to adopt a mode in which the selection transistor is formed of a Fin-FET. As a result, it is possible to suppress short-channel properties. Alternatively, it is possible to adopt a mode in which the selection transistor is formed of a semiconductor element having a tri-gate structure or a semiconductor element having a GAA (Gate-All-Around) structure or an Omega (Ω) structure as a channel formation region (specifically, for example, a FET in which a channel formation region is formed of a nanowire or a nanosheet). The selection transistor may be an n-channel transistor or a p-channel transistor.

In the nonvolatile memory cell of the first mode or the second mode in a case where the selection transistor is formed of the n-channel transistor, the first conductivity type may be n-type, the second conductivity type may be p-type, the first layer may be connected to one end of the nonvolatile memory element, and the second layer may be connected to the write line. On the other hand, in the nonvolatile memory cell of the first mode or the second mode in a case where the selection transistor is formed of the p-channel transistor, the first conductivity type may be p-type, the second conductivity type may be n-type, the first layer may be connected to one end of the nonvolatile memory element, and the second layer may be connected to the write line.

In addition, in the nonvolatile memory cell of the third mode in a case where the selection transistor is formed of the n-channel transistor, the conductivity type of the impurity may be n-type. In this case, examples of the metal include aluminum (Al), gold (Au), tungsten (W), and platinum (Pt). In addition, in the nonvolatile memory cell of the third mode in a case where the selection transistor is formed of the p-channel transistor, the conductivity type of the impurity may be p-type. In this case, examples of the metal include indium (In) and tin (Sn).

Further, in the nonvolatile memory cell of the fourth mode in a case where the selection transistor is formed of the n-channel transistor, the conductivity type of the impurity may be n-type. In the nonvolatile memory cell of the fourth mode in a case where the selection transistor is formed of the p-channel transistor, the conductivity type of the impurity may be p-type. Although a barrier metal layer is formed in order to form a connection hole to be described later, a Schottky junction can be formed between the second layer made of germanium (Ge) or silicon-germanium (Si—Ge) containing an impurity and the barrier metal layer in the nonvolatile memory cell of the fourth mode. In a case where the conductivity type of the impurity is n-type, aluminum (Al), gold (Au), tungsten (W), and platinum (Pt) can be exemplified as a material forming the barrier metal layer. In a case where the conductivity type of the impurity is p-type, yttrium (Y), erbium (Er), ytterbium (Yb), lanthanum (La), hafnium (Hf), zirconium (Zr), aluminum (Al), titanium (Ti), gold (Au), nickel (Ni), and platinum (Pt) can be exemplified as a material forming the barrier metal layer.

In the nonvolatile memory cell of the present disclosure and the like including the various preferable modes and configurations described above, a nonvolatile memory element formed of a spin transfer torque-based magnetic random access memory of a perpendicular magnetization type (hereinafter, simply referred to as the "spin transfer torque-based magnetic random access memory") includes at least a storage layer and a magnetization fixed layer. Specifically, it is possible to adopt a configuration in which the nonvolatile memory element has a layered structure body including at least a magnetization fixed layer, an intermediate layer, and a storage layer.

It is possible to adopt a mode in which a magnetization direction of the storage layer changes according to information to be stored and an easy-magnetization axis is parallel to a layered direction of the layered structure body (that is, a perpendicular magnetization type). Thus, in this case, the mode of being formed of the spin transfer torque-based magnetic random access memory of the perpendicular magnetization type can be adopted as described above. Further, in these cases, it is possible to adopt a mode in which a first surface of the layered structure body is connected to a conductive underlayer, a second surface of the layered structure body is connected to a conductive connecting portion, and information is stored in the storage layer with a current (which is also referred to as a magnetization reversal current or a spin-polarized current and is a write current) flowing between the underlayer and the connecting portion. That is, it is possible to adopt a mode in which the magnetization direction of the storage layer is changed by causing the magnetization reversal current to flow in the layered direction of the layered structure body and information is recorded in the storage layer. The underlayer is connected to one source/drain region of a selection transistor, and the connecting portion is connected to a bit line.

As described above, it is possible to adopt a mode in which the magnetization fixed layer is connected to the one source/drain region of the selection transistor via the underlayer. That is, it is possible to adopt a mode in which the magnetization fixed layer forms the first surface of the layered structure body, whereby the layered structure body that is stable in terms of a material can be obtained. However, the present invention is not limited thereto, and the storage layer may form the first surface of the layered structure body.

Figure 18:
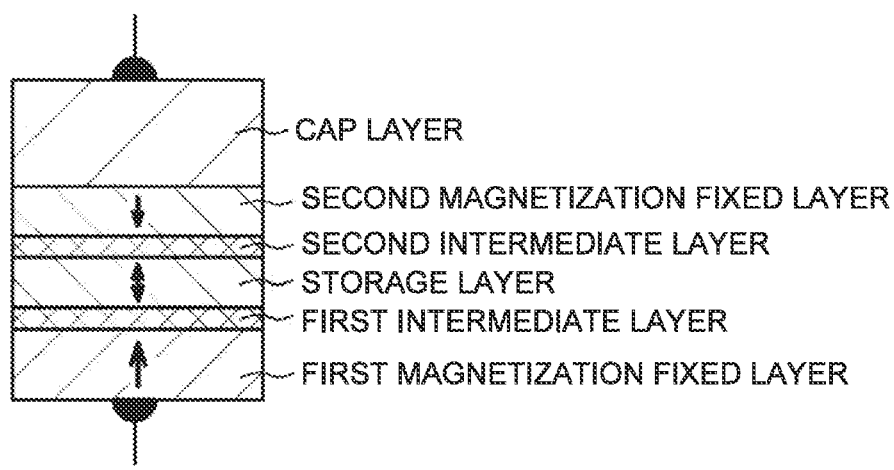
FIG. 18 is a conceptual diagram of another configuration example of the nonvolatile memory element in the present disclosure.
Figure 19:
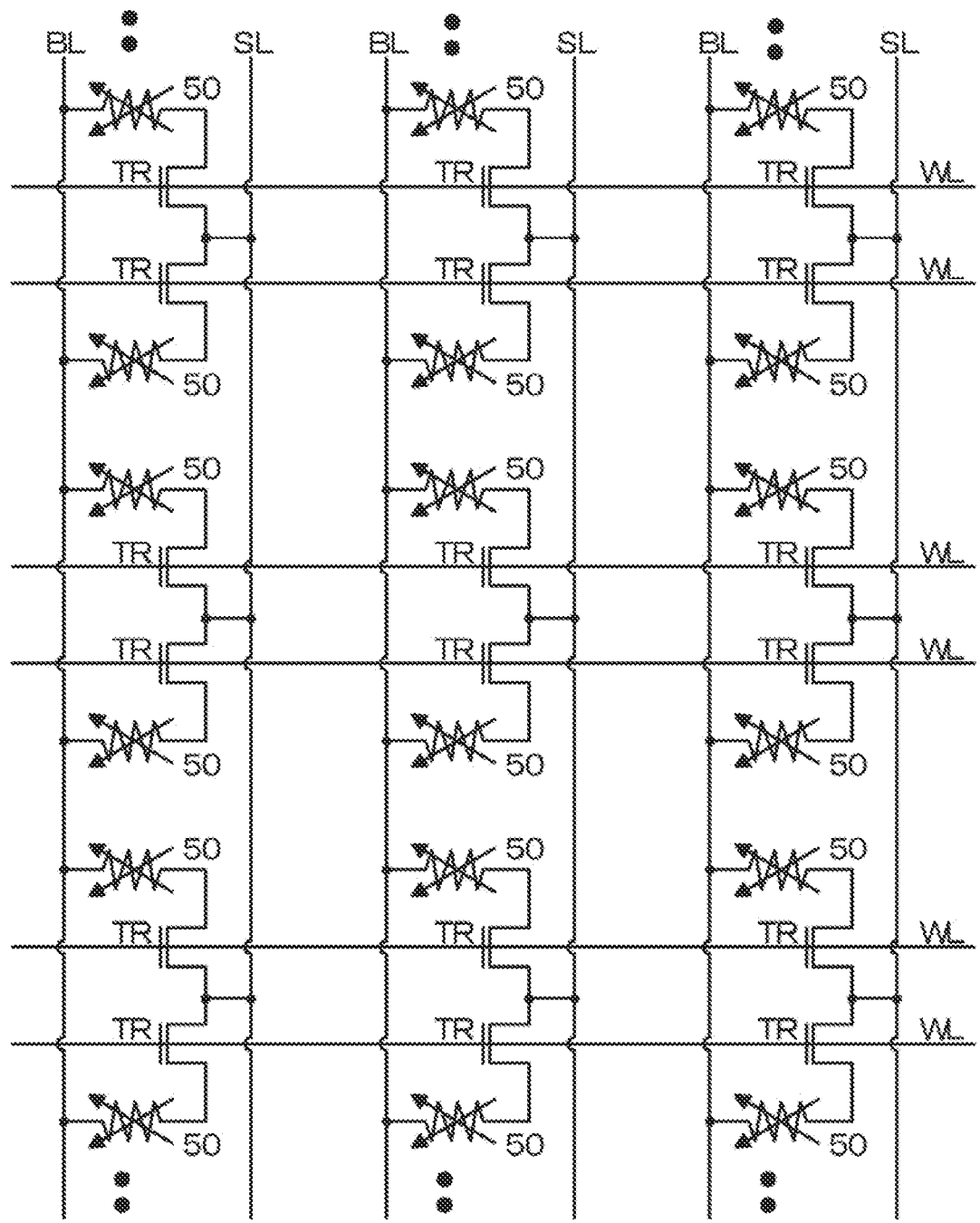
FIG. 19 is an equivalent circuit diagram of a conventional nonvolatile memory cell including a nonvolatile memory element and a selection transistor.
Figure 20A:
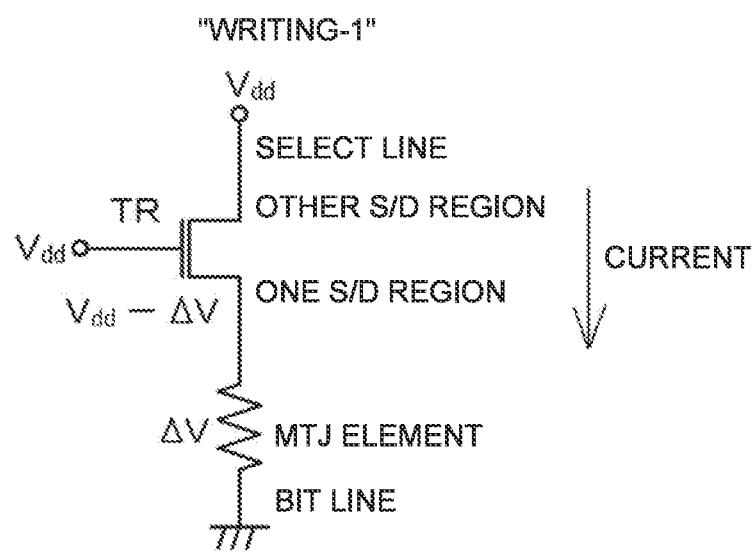
FIGS. 20A and 20B are an equivalent circuit diagram in "Writing-0" in which a current flows from a select line to a bit line and an equivalent circuit diagram in "Writing-1" in which a current flows from the bit line to the select line, respectively.
Figure 20B:
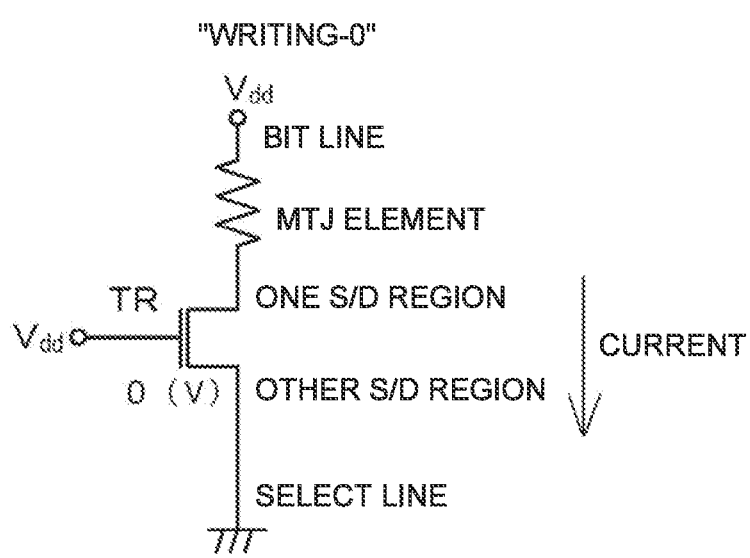

As described above, the spin transfer torque-based magnetic random access memory can have a structure in which a layered structure body having a tunnel magnetoresistance (TMR) effect or a giant magnetoresistance (GMR) effect is formed of the layered structure body including the storage layer, the intermediate layer, and the magnetization fixed layer. Thus, for example, when the magnetization reversal current is caused to flow from the storage layer to the magnetization fixed layer in a magnetization state of an antiparallel arrangement, the magnetization of the storage layer is reversed by a spin torque acting as electrons are injected from the magnetization fixed layer to the storage layer, and the magnetization direction of the storage layer, a magnetization direction of the magnetization fixed layer (specifically, a reference layer), and the magnetization direction of the storage layer form a parallel arrangement. On the other hand, for example, when the magnetization reversal current is caused to flow from the magnetization fixed layer to the storage layer in a magnetization state of a parallel arrangement, the magnetization of the storage layer is reversed by a spin torque acting as electrons flow from the storage layer to the magnetization fixed layer, and the magnetization direction of the storage layer and the magnetization direction of the magnetization fixed layer (specifically, the reference layer) form an antiparallel arrangement. Alternatively, a structure (double spin filter structure) in which a layered structure body having a TMR effect or a GMR effect is formed of a magnetization fixed layer, an intermediate layer, a storage layer, an intermediate layer, and a magnetization fixed layer can be adopted as illustrated in a conceptual diagram of FIG. 18. In such a structure, it is necessary to make a difference in change in magnetoresistance between the two intermediate layers located above and below the storage layer.

Here, it is possible to adopt a mode in which metal atoms forming the magnetization fixed layer and the storage layer include a cobalt (Co) atom, an iron (Fe) atom, or the cobalt atom and the iron atom (Co—Fe). In other words, it is possible to adopt the mode in which the metal atoms forming the magnetization fixed layer and the storage layer include at least the cobalt (Co) atom or the iron (Fe) atom. That is, it is possible to adopt the mode in which the magnetization fixed layer and the storage layer is made of a metal material (alloy or compound) containing at least cobalt (Co) or iron (Fe).

Alternatively, the storage layer is made of at least one kind of metal material (alloy or compound) selected from a group consisting of cobalt, iron, and nickel, and preferably, the storage layer is made of a metal material (alloy or compound) including cobalt, iron, and nickel, or may adopt a mode of being made of a metal material (alloy or compound) including cobalt, iron, nickel, and boron. Alternatively, examples of the material forming the storage layer can include alloys (for example, Co—Fe, Co—Fe—B, Co—Fe—Ni, Fe—Pt, Ni—Fe, Fe—B, Co—B, and the like) of ferromagnetic materials such as nickel (Ni), iron (Fe), and cobalt (Co), or alloys obtained by adding gadolinium (Gd) to these alloys. Further, in order to further increase perpendicular magnetic anisotropy in the perpendicular magnetization type, heavy rare earths, such as terbium (Tb), dysprosium (Dy), and holmium (Ho), may be added to such alloys, or an alloy containing these may be layered. The crystallinity of the storage layer is substantially arbitrary, and may be polycrystalline, single crystal, or amorphous. In addition, the storage layer can have a single-layer configuration or a layered configuration in which the above-described plurality of different ferromagnetic material layers are layered, or can also have a layered configuration in which a ferromagnetic material layer and a nonmagnetic body layer are layered.

In addition, it is also possible to add a nonmagnetic element to the material forming the storage layer. When the nonmagnetic element is added, effects, such as improvement of heat resistance due to prevention of diffusion, an increase of a magnetoresistance effect, and an increase in dielectric voltage accompanying planarization, can be obtained. Examples of the nonmagnetic element to be added include B, C, N, O, F, Li, Mg, Si, P, Ti, V, Cr, Mn, Ni, Cu, Ge, Nb, Ru, Rh, Pd, Ag, Ta, Ir, Pt, Au, Zr, Hf, W, Mo, Re, and Os.

In addition, ferromagnetic material layers having different compositions can be also layered as the storage layer. Alternatively, a ferromagnetic material layer and a soft magnetic material layer can be layered, or a plurality of ferromagnetic material layers can also be layered with a soft magnetic material layer or a nonmagnetic body layer interposed therebetween. Particularly, in a case of adopting a configuration in which a plurality of ferromagnetic material layers, such as an Fe layer, a Co layer, an Fe—Ni alloy layer, a Co—Fe alloy layer, a Co—Fe—B alloy layer, a Fe—B alloy layer, and a Co—B alloy layer, are layered with a nonmagnetic body layer interposed therebetween, a mutual relation of magnetic strength between the ferromagnetic material layers can be adjusted, and thus, the magnetization reversal current can be suppressed from being increased in the spin transfer torque-based magnetic random access memory. Examples of a material of the nonmagnetic body layer include Ru, Os, Re, Ir, Au, Ag, Cu, Al, Bi, Si, B, C, Cr, Ta, Pd, Pt, Zr, Hf, W, Mo, Nb, and V and alloys thereof.

A thickness of the storage layer can be set to 0.5 nm to 30 nm, for example, and a thickness of the magnetization fixed layer can be set to 0.5 nm to 30 nm, for example.

The magnetization fixed layer may have a layered ferri-structure (also referred to as a layered ferri-pinned structure) in which at least two magnetic material layers are layered. Specifically, the layered ferri-structure is a layered structure having antiferromagnetic coupling, that is, a structure in which interlayer exchange coupling between the two magnetic material layers becomes antiferromagnetic, and is also referred to as synthetic antiferromagnet (SAF), and further represents a structure in which interlayer exchange coupling between the two magnetic material layers becomes antiferromagnetic or ferromagnetic in accordance with a thickness of a nonmagnetic layer, provided between the two magnetic material layers (one magnetic material layer is sometimes referred to as a "reference layer", and the other magnetic material layer constituting the layered ferri-structure is sometimes referred to as a "fixed layer"), which is reported by, for example, S. S. Parkin et al., on pp 2304-2307 in Physical Review Letters on 7 May (1990). Here, a magnetization direction of the reference layer is a magnetization direction which serves as a reference of information to be stored in the storage layer. The one magnetic material layer (reference layer) constituting the layered ferri-structure is located on the storage layer side. That is, the reference layer is in contact with the intermediate layer.

When the layered ferri-structure is adopted for the magnetization fixed layer, the asymmetry of thermal stability with respect to an information writing direction can be reliably canceled, and the stability with respect to a spin torque can be improved.

Then, in this case, the one magnetic material layer (for example, the reference layer) constituting the layered ferri-structure can contain at least one kind of element selected from a group consisting of iron (Fe), cobalt (Co), and nickel (Ni), or contains boron (B) and at least one kind of element selected from the group including iron (Fe), cobalt (Co), and nickel (Ni), and specifically, can include a Co—Fe alloy, a Co—Fe—Ni alloy, a Ni—Fe alloy, or a Co—Fe—B alloy or can also include a layered structure such as an Fe layer/Pt layer, an Fe layer/Pd layer, a Co layer/Pt layer, a Co layer/Pd layer, a Co layer/Ni layer, and a Co layer/Rh layer. A nonmagnetic element, such as Ag, Cu, Au, Al, Si, Bi, Ta, B, C, O, N, Pd, Pt, Zr, Ta, Hf, Ir, W, Mo, Nb, V, Ru, and Rh, may be added to these materials to adjust magnetic properties, or to adjust various physical properties such as a crystal structure, crystallinity, and stability of a substance.

In addition, it is possible to adopt a mode in which the other magnetic material layer (for example, the fixed layer) constituting the layered ferri-structure is made of a material containing, as main components, at least one kind of element (referred to as "element-A" for convenience) selected from a group consisting of iron (Fe), cobalt (Co), nickel (Ni), and manganese (Mn), and at least one kind of element (which is an element different from the above-described element-A, and is referred to as "element-B" for convenience) selected from a group consisting of platinum (Pt), palladium (Pd), nickel (Ni), iridium (Ir), and rhodium (Rh).

In addition, examples of a material forming the nonmagnetic layer can include ruthenium (Ru), an alloy thereof, and a ruthenium compound, or can include Os, Re, Ir, Au, Ag, Cu, Al, Bi, Si, B, C, Cr, Ta, Pd, Pt, Zr, Hf, W, Mo, Nb, V, and Rh and alloys thereof.

Alternatively, the fixed layer may have a layered structure of Co thin film/Pt thin film, the reference layer may have a layered structure of Co thin film/Pt thin film/CoFeB thin film (where, the CoFeB thin film is in contact with the intermediate layer) in order to increase an MR ratio, and a nonmagnetic layer containing, for example, Ru may be arranged between the fixed layer and the reference layer.

In addition, the magnetization fixed layer can have a configuration in which a direction of magnetization is fixed only by a ferromagnetic layer or by using antiferromagnetic coupling between an antiferromagnetic layer and a ferromagnetic layer. Specific examples of the antiferromagnetic material include an Fe—Mn alloy, an Fe—Pt alloy, a Ni—Mn alloy, a Pt—Mn alloy, a Pt—Cr—Mn alloy, an Ir—Mn alloy, a Rh—Mn alloy, a Co—Pt alloy, a cobalt oxide, a nickel oxide (NiO), and an iron oxide ($Fe_2O_3$). Alternatively, a nonmagnetic element, such as Ag, Cu, Au, Al, Si, Bi, Ta, B, C, O, N, Pd, Pt, Zr, Ta, Hf, Ir, W, Mo, Nb, V, Ru, and Rh, may be added to these materials to adjust magnetic properties or to adjust various physical properties such as a crystal structure, crystallinity, and stability of a substance. Examples of a material forming the nonmagnetic layer can include ruthenium (Ru), an alloy thereof, and a ruthenium compound, or can include Os, Re, Ir, Au, Ag, Cu, Al, Bi, Si, B, C, Cr, Ta, Pd, Pt, Zr, Hf, W, Mo, Nb, V, and Rh and alloys thereof.

However, the magnetization fixed layer is not limited to the mode having the layered ferri-structure. A magnetization fixed layer, which is formed of one layer and functions as the reference layer, can also be used. Examples of a material forming such a magnetization fixed layer include a material (ferromagnetic material) forming the storage layer. Alternatively, the magnetization fixed layer (reference layer) can be formed of a laminate of a Co layer and a Pt layer, a laminate of a Co layer and a Pd layer, a laminate of a Co layer and a Ni layer, a laminate of a Co layer and a Tb layer, a Co—Pt alloy layer, a Co—Pd alloy layer, a Co—Ni alloy layer, a Co—Fe alloy layer, a Co—Tb alloy layer, a Co layer, an Fe layer, or a Co—Fe—B alloy layer. Alternatively, a nonmagnetic element, such as Ag, Cu, Au, Al, Si, Bi, Ta, B, C, O, N, Pd, Pt, Zr, Hf, Ir, W, Mo, Nb, V, Ru, Pd, Pt, Pt, Zr, Hf, Ir, W, Mo, Nb, V, Ru, and Rh, may be added to adjust magnetic properties or to adjust various physical properties such as a crystal structure, crystallinity, and stability of a substance. Further, preferably, the magnetization fixed layer (reference layer) can be formed of a Co—Fe—B alloy layer.

Since the magnetization direction of the magnetization fixed layer serves as the reference of information, the magnetization direction should not be changed by recording or reading of information, but is not necessarily fixed in a specific direction. It is sufficient to adopt a configuration and a structure in which the magnetization direction is less likely to change than that of the storage layer by increasing a coercive force, a thickness, or a magnetic damping constant than that of the storage layer.

The intermediate layer is preferably made of a nonmagnetic material. That is, in the spin transfer torque-based magnetic random access memory, the intermediate layer in the case of constituting the layered structure body having the TMR effect is preferably made of an insulating material which is a nonmagnetic material. The layered structure body having the TMR effect, which is formed of the magnetization fixed layer, the intermediate layer, and the storage layer, represents a structure in which an intermediate layer, made of a nonmagnetic material film functioning as a tunnel insulating film is sandwiched between the magnetization fixed layer made of a magnetic material and the storage layer made of a magnetic material. Here, examples of the material which is the insulating material and is the nonmagnetic material include various insulating materials, such as a magnesium oxide (MgO), a magnesium nitride, a magnesium fluoride, an aluminum oxide ($AlO_x$), an aluminum nitride (AiM), a silicon oxide ($SiO_x$), a silicon nitride (SiN), $TiO_2$, $Cr_2O_3$, Ge, NiO, $CdO_x$, $HfO_2$, $Ta_2O_5$, $Bi_2O_3$, CaF, $SrTiO_2$, $AlLaO_3$, Mg—$Al_2$—O, Al—N—O, BN, and ZnS, a dielectric material, and a semiconductor material. An area resistance value of the intermediate layer made of the insulating material is preferably about several tens $\Omega \cdot \mu m^2$ or less. In a case where the intermediate layer is made of a magnesium oxide (MgO), the MgO layer is desirably crystallized, and more desirably has crystal orientation in a (001) direction. In addition, in a case where the intermediate layer is made of a magnesium oxide (MgO), a thickness thereof is desirably 1.5 nm or less. On the other hand, examples of a material forming the nonmagnetic material film constituting the layered structure body having the GMR effect include conductive materials such as Cu, Ru, Cr, Au, Ag, Pt, Ta, and alloys thereof. If the conductivity is high (resistivity is several hundred $\mu\Omega$ cm or less), any nonmetallic material may be used, but it is desirable to appropriately select a material that hardly causes an interface reaction with the storage layer or the magnetization fixed layer.

The intermediate layer made of the insulating material which is the nonmagnetic material can be obtained by, for example, oxidizing or nitriding a metal film formed by a sputtering method. More specifically, in a case where an aluminum oxide ($AlO_x$) or a magnesium oxide (MgO) is used as the insulating material forming the intermediate layer, for example, it is possible to exemplify a method of oxidizing aluminum or magnesium formed by a sputtering method in the atmosphere, a method of oxidizing aluminum or magnesium formed by a sputtering method with plasma, a method of oxidizing aluminum or magnesium formed by a sputtering method with IPC plasma, a method of naturally oxidizing aluminum and magnesium formed by a sputtering method in oxygen, a method of oxidizing aluminum and magnesium formed by a sputtering method with oxygen radicals, a method of emitting ultraviolet rays when naturally oxidizing aluminum or magnesium formed by a sputtering method in oxygen, a method of depositing aluminum or magnesium by a reactive sputtering method, and a method of depositing an aluminum oxide ($AlO_x$) or a magnesium oxide (MgO) by a sputtering method.

A three-dimensional shape of the layered structure body is desirably cylindrical or columnar from the viewpoint of ensuring ease of processing and uniformity in a direction of an easy-magnetization axis in the storage layer, but is not limited thereto, and can be a triangular prism, a quadrangular prism, a hexagonal prism, an octagonal prism, and the like (including those in which a side edge or a side ridge is rounded) or an elliptic prism. The area of the layered structure body is preferably, for example, 0.01 $\mu m^2$ or less from the viewpoint of easily reversing the magnetization direction with a low magnetization reversal current. Information is written in the storage layer by causing the magnetization reversal current to flow through the layered structure body from the underlayer to the connecting portion or from the connecting portion to the underlayer so as to set the magnetization direction in the storage layer to a first direction (direction parallel to the easy-magnetization axis) or a second direction (direction opposite to the first direction).

Further, the layered structure body can adopt a mode in which a cap layer is formed on the second surface side in order to prevent mutual diffusion of atoms constituting an electrode or the connecting portion and atoms constituting the storage layer, reduce contact resistance, and prevent oxidation of the storage layer. Thus, in this case, the cap layer can adopt a mode of having a single-layer structure including at least one kind of material selected from a group consisting of hafnium, tantalum, tungsten, zirconium, niobium, molybdenum, titanium, vanadium, chromium, magnesium, ruthenium, rhodium, palladium, and platinum; a single-layer structure including an oxide, such as a magnesium oxide layer, an aluminum oxide layer, a titanium oxide layer, a silicon oxide layer, a $Bi_2O_3$ layer, a $SrTiO_2$ layer, an $AlLaO_3$ layer, an Al—N—O layer, a Mg—Ti—O layer, and a $MgAl_2O_4$ layer; or a layered structure (for example, Ru layer/Ta layer) including at least one kind of a material layer selected from a group consisting of hafnium, tantalum, tungsten, zirconium, niobium, molybdenum, titanium, vanadium, chromium, magnesium, ruthenium, rhodium, palladium, and platinum and at least one kind of an oxide layer selected from a group consisting of MgTiO, MgO, AlO, and SiO.

The above-described various layers can be formed by, for example, a physical vapor deposition method (PVD method) exemplified by a sputtering method, an ion beam deposition method, and a vacuum deposition method, or a chemical vapor deposition method (CVD method) represented by an atomic layer deposition (ALD) method. In addition, patterning of these layers can be performed by a reactive ion etching method (RIE method) or an ion milling method (ion beam etching method). It is preferable to form the various layers consecutively in a vacuum apparatus, and it is preferable to perform patterning thereafter.

The underlayer, the connecting portion, the bit line, the select line, various wirings, a wiring layer, and the like may have a single-layer structure of Ta or TaN, or Cu, Al, Au, Pt, Ti, Ru, W, and the like, or a compound thereof, or have a layered structure including the underlayer containing Cr, Ti, or the like and a Cu layer, an Au layer, a Pt layer, and the like formed thereon may be provided. Alternatively, a single-layer structure of Ta or a compound thereof, or a layered structure having Cu, Ti, or a compound thereof can also be formed. These electrodes and the like can be formed by, for example, a PVD method exemplified by a sputtering method. The bit line may be integrated with the connecting portion, or the bit line can also adopt a mode of serving as the connecting portion.

A connection hole that electrically connects the underlayer and the selection transistor or a connection hole that electrically connects the write line and the selection transistor can be made of polysilicon doped with impurities, high-melting-point metal, such as tungsten, Ti, Pt, Pd, Cu, TiW, TiNW, $WSi_2$, and $MoSi_2$, or a metal silicide, and can be formed on the basis of a CVD method or a PVD method exemplified by a sputtering method. A barrier metal layer is formed on an inner wall and a bottom of the connection hole. In addition, examples of a material forming various insulating layers and various interlayer insulating layers include a silicon oxide ($SiO_2$), a silicon nitride (SiN), SiON, SiOC, SiOF, SiCN, spin on glass (SOG), non-doped silicate glass (NSG), boron-phosphorus silicate glass (BPSG), PSG, BSG, PbSG, AsSG, SbSG, LTO, and $Al_2O_3$. Alternatively, an insulating material with a low dielectric constant (for example, fluorocarbon, cycloperfluorocarbon polymer, benzocyclobutene, cyclic fluororesin, polytetrafluoroethylene, amorphous tetrafluoroethylene, polyaryl ether, fluorinated aryl ether, fluorinated polyimide, organic SOG, parylene, fluorinated fullerene, or amorphous carbon), polyimide-based resin, fluorine-based resin, Silk (trademark of The Dow Chemical Co., and is a coat-type low-dielectric-constant material for an interlayer insulation film), Flare (trademark of Honeywell Electronic Materials Co., and a polyallylether (PAE)-based material) can be exemplified, and can be used alone or in combination as appropriate. Alternatively, a high-K (high dielectric constant) film (for example, a Hf oxide, $Al_2O_3$, a Ru oxide, a Ta oxide, a Si oxide containing Al, Ru, Ta, and Hf, a Si nitride containing Al, Ru, Ta, and Hf, and a Si oxynitride containing Al, Ru, Ta, and Hf) that can be formed at a low temperature can be exemplified. Alternatively, polymethyl methacrylate (PMMA); polyvinylphenol (PVP); polyvinyl alcohol (PVA); polyimide; polycarbonate (PC); polyethylene terephthalate (PET); polystyrene; a silanol derivative (silane coupling agent such as N-2 (aminoethyl) 3-aminopropyltrimethoxysilane (AEAPTMS), 3-mercaptopropyl trimethoxysilane (MPTMS), and octadecyltrichlorosilane (OTS); a novolak type phenolic resin; a fluorine-based resin; and organic insulating materials (organic polymers) exemplified as a straight-chain hydrocarbon having, in one end thereof, a functional group capable of being bound to a control electrode such as octadecanethiol and dodecyl isocyanate, and combinations thereof can also be used. The various insulating layers and the various interlayer insulating layers can be formed on the basis of a known method, such as various CVD methods, a coating method, various PVD methods including a sputtering method and a vacuum deposition method, various printing methods such as a screen printing method, and a sol-gel method.

The base portion can be configured using, for example, a silicon semiconductor substrate, or can also be configured using an SOI substrate (specifically, a silicon layer forming an SOI substrate or the like). Examples of the SOI substrate include an SOI substrate formed on the basis of a smart cut method and a substrate bonding technology, a SOI substrate which is formed based on a separation by implantation of oxygen (SIMOX) method, and a SOI substrate in which an insulating layer is formed on a surface of the silicon semiconductor substrate and a silicon layer is formed on the insulating layer. Alternatively, the base portion can also be configured using an InGaAs layer or a Ge layer, instead of the silicon layer.

Examples of the nonvolatile memory cell of the present disclosure or an electronic device incorporating the nonvolatile memory cell array include portable electronic devices, such as a mobile device, a game device, a music device, and a video device, fixed electronic devices, and a magnetic head can also be exemplified. In addition, a storage device including the nonvolatile memory cell array of the present disclosure can also be exemplified.

First Embodiment

Figure 3:
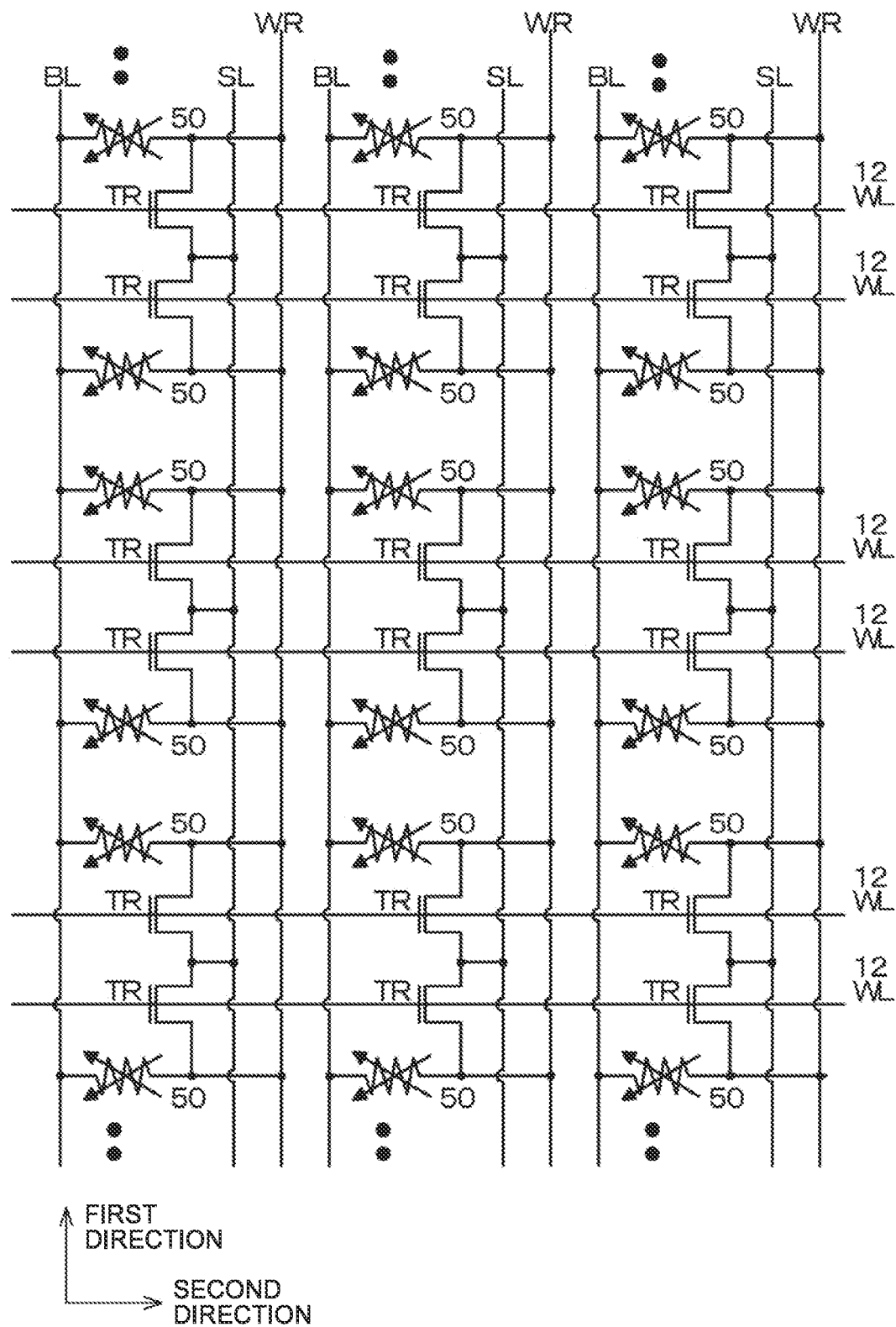
FIG. 3 is an equivalent circuit diagram of a nonvolatile memory cell of the present disclosure including a nonvolatile memory element and a selection transistor.

A first embodiment relates to a nonvolatile memory cell, a nonvolatile memory cell array, and an information writing method of the nonvolatile memory cell array of the present disclosure. FIG. 1 illustrates a schematic partial cross-sectional view of the nonvolatile memory cell of the first embodiment, and FIG. 3 illustrates an equivalent circuit diagram of the nonvolatile memory cell of the present disclosure including a nonvolatile memory element and a selection transistor. In addition, conceptual diagrams of the nonvolatile memory element to which magnetization reversal by spin injection is applied are illustrated in FIGS. 4A, 4B, and 4C and FIGS. 5A, 5B, and 5C. Note that an "upper and lower relation" is relative, and is based on a base portion.

The nonvolatile memory cell of the first embodiment or second to fifth embodiments to be described later includes a resistance-change nonvolatile memory element 50 and a selection transistor TR.

One end of the nonvolatile memory element 50 is connected to one source/drain region 15A of the selection transistor TR and is connected to a write line WR.

The other source/drain region 15B of the selection transistor TR is connected to a select line SL.

The other end of the nonvolatile memory element 50 is connected to a bit line BL.

In addition, in the nonvolatile memory cell array of the first embodiment or the second to fifth embodiments to be described later, a plurality of nonvolatile memory cells are arranged in a two-dimensional matrix in a first direction and a second direction different from the first direction.

Each of the plurality of nonvolatile memory cells arranged along the first direction includes a resistance-change nonvolatile memory element 50 and a selection transistor TR.

One end of the nonvolatile memory element 50 is connected to one source/drain region 15A of the selection transistor TR and is connected to a write line WR common to the plurality of nonvolatile memory cells arranged along the first direction.

The other source/drain region 15B of the selection transistor TR is connected to a select line SL common to the plurality of nonvolatile memory cells arranged along the first direction.

The other end of the nonvolatile memory element 50 is connected to a bit line BL common to the plurality of nonvolatile memory cells arranged along the first direction.

Note that a gate electrode 12 of the selection transistor TR is connected to a word line WL extending in the second direction, or also serves as the word line WL. In addition, the number of the nonvolatile memory cells arranged along the first direction is substantially arbitrary, but can be set to four or eight, for example.

In the nonvolatile memory cell of the first embodiment or the second to fifth embodiments to be described later, a nonvolatile memory element 50 is formed of a spin transfer torque-based magnetic random access memory of a perpendicular magnetization type. Thus, the nonvolatile memory element 50 includes at least a storage layer 53 and a magnetization fixed layer 51 (specifically, includes the magnetization fixed layer 51, an intermediate layer 52, and the storage layer 53), and the magnetization fixed layer 51 is connected to one source/drain region 15A of a selection transistor TR although not limited thereto. The magnetization fixed layer 51, the intermediate layer 52, and the storage layer 53 are collectively referred to as a "layered structure body 50A".

Further, in the nonvolatile memory cell of the first embodiment or the second to third embodiments to be described later, the selection transistor TR and a write line WR are provided on a first surface 10A side of a base portion 10, made of a semiconductor material (specifically, for example, a part of a silicon semiconductor substrate), and the nonvolatile memory element 50 is provided on a second surface 10B side opposing the first surface 10A of the base portion 10.

In addition, in the first embodiment or the second to fourth embodiments to be described later, the selection transistor TR includes an n-channel field effect transistor (known MOS-FET).

In the nonvolatile memory cell of the first embodiment or the second to fifth embodiments to be described later, a magnetization direction of the storage layer 53 changes in response to information to be stored. Thus, in the storage layer 53, an easy-magnetization axis is parallel to a layered direction of the layered structure body 50A (that is, a perpendicular magnetization type). That is, the nonvolatile memory cell is formed of the spin transfer torque-based magnetic random access memory of the perpendicular magnetization type, more specifically, an MTJ element. A magnetization direction of the magnetization fixed layer 51 is a magnetization direction serving as a reference of information to be stored in the storage layer 53, and information "0" and information "1" are defined by a relative angle between the magnetization direction of the storage layer 53 and the magnetization direction of the magnetization fixed layer 51. A first surface 50a of the layered structure body 50A is in contact with a conductive underlayer 41, a second surface 50b of the layered structure body 50A is in contact with a conductive connecting portion 42, and information is stored in the storage layer 53 by a current (magnetization reversal current) flowing between the underlayer 41 and the connecting portion 42. Note that the magnetization fixed layer 51 may form the first surface 50a of the layered structure body 50A, and the storage layer 53 may form the first surface 50a of the layered structure body 50A.

In the nonvolatile memory cell of the first embodiment or the second to fifth embodiments to be described later, metal atoms forming the magnetization fixed layer 51 and the storage layer 53 include a cobalt (Co) atom, an iron (Fe) atom, or the cobalt atom and iron atom (Co—Fe). Specifically, the magnetization fixed layer 51 and the storage layer 53 include a Co—Fe—B alloy layer [for example, $(Co_{20}Fe_{80})_{80}B_{20}$ alloy layer]. In addition, metal atoms forming the intermediate layer 52 made of a nonmagnetic material functioning as a tunnel insulating film include a magnesium (Mg) atom or an aluminum (Al) atom. Specifically, MgO is contained. When the intermediate layer 52 is made of the MgO layer, a magnetoresistance change rate (MR ratio) can be increased. As a result, the efficiency of spin injection can be improved, and it is possible to reduce the magnetization reversal current density required to reverse the magnetization direction of the storage layer 53. A three-dimensional shape of the layered structure body 50A is cylindrical (columnar), but is not limited thereto, and may be, for example, a quadrangular prism. The layered structure body 50A is surrounded by an insulating layer 33.

The above-described various layer configurations are listed in the following Table 1. Note that a layer after "/" is a layer closer to the base portion 10 in the layered direction (thickness direction).

<Table 1>
Connecting portion 42: Al or Cu
Cap layer 54: Ta (3 nm)/Ru (5 nm)/Ta (1 nm)
Layered structure body 50A
Storage layer 53: $(CO_{20}Fe_{80})_{80}B_{20}$ layer (1.2 nm to 1.7 nm)
Intermediate layer 52: Mg (0.15 nm)/MgO (1 nm)/Mg (0.15 nm)
Magnetic fixed layer 51: $(CO_{20}Fe_{80})_{80}B_{20}$ layer (1 nm)/Ru (0.8 nm)/Co (1.1 nm)/Pt (5 nm)
Underlayer 41: Ru (25 nm)/Ta (3 nm)

For example, the selection transistor TR formed on the first surface 10A side of the base portion 10, formed of a part of the silicon semiconductor substrate, includes a channel formation region 14 formed in the base portion 10, the source/drain regions 15A and 15B, and the gate electrode 12 provided to oppose the channel formation region 14 with a gate insulating layer 13 interposed therebetween. A gate sidewall 16 made of $SiO_2$ is formed on a sidewall of the gate electrode 12. The selection transistor TR is covered with a lower insulating layer 21. Reference numeral 11 denotes an element isolation region having a shallow trench isolation (STI) structure. Note that an MOS-FET that is always in a non-conductive state may be formed to perform element isolation, instead of forming the element isolation region.

A projection image in an extending direction of the bit line BL is orthogonal to, but not limited to, a projection image in an extending direction of the gate electrode 12 (for example, which also functions as a word line or an address line) forming the selection transistor TR. A projection image in an extending direction of the select line SL, the projection image in the extending direction of the bit line BL, and a projection image in an extending direction of the write line WR are parallel. However, the illustrated extending direction of the select line SL is different from the above description in order to simplify the drawing in FIG. 1 or FIGS. 2 and 6 to 16 to be described later.

The select line SL is formed on the lower insulating layer 21. The other source/drain region 15B of the selection transistor TR is connected to the select line SL via a connection hole 22 provided in the lower insulating layer 21. A barrier metal layer 22A is formed on an inner wall and a bottom of the connection hole 22. An upper insulating layer 25 is formed on the lower insulating layer 21 and the select line SL, and the write line WR is formed on the upper insulating layer 25. The one source/drain region 15A of the selection transistor TR is connected to the write line WR via a connection hole 23 formed in the lower insulating layer 21, a contact portion 24 formed on the lower insulating layer 21, and a connection hole 26 formed in the upper insulating layer 25. Barrier metal layers 23A and 26A are formed on inner walls and bottoms of the connection holes 23 and 26, respectively.

An interlayer insulating layer 31 is formed on the second surface 10B of the base portion 10, and an underlayer 41 is formed on the interlayer insulating layer 31. The underlayer 41 is connected to the one source/drain region 15A of the selection transistor TR via a connection hole 32 provided in the interlayer insulating layer 31. A barrier metal layer 32A is formed on an inner wall and a bottom of the connection hole 32. The layered structure body 50A is in contact with the underlayer 41 and a connecting portion 42. The insulating layer 33 covers the interlayer insulating layer 31. The bit line BL formed on the insulating layer 33 is connected to the connecting portion 42. A cap layer 54 is formed between the connecting portion 42 and the layered structure body 50A.

Hereinafter, a method for manufacturing the nonvolatile memory cell of the first embodiment will be described.

[Step-100]

First, the element isolation region 11 is formed on a silicon semiconductor substrate on the basis of a known method, and the selection transistor TR, formed of the gate insulating layer 13, the gate electrode 12, the gate sidewall 16, and the source/drain regions 15A and 15B, is formed in a portion of the silicon semiconductor substrate surrounded by the element isolation region 11. A portion of the silicon semiconductor substrate located between the source/drain region 15A and the source/drain region 15B corresponds to the channel formation region 14. Note that, in some cases, the source/drain regions 15A and 15B can be also formed of a silicide layer. In this case, the silicide layer functions as a kind of stopper when the silicon semiconductor substrate to be described next is thinned. Next, the lower insulating layer 21, the connection holes 22 and 23, the barrier metal layers 22A and 23A, the select line SL, and the contact portion 24 are formed, and further, the upper insulating layer 25 is formed on the entire surface, and then, the connection hole 26, the barrier metal layer 26A, and the write line WR are formed.

The lower insulating layer 21 is made of SiN, the contact portion 24 is made of copper (Cu), the connection holes 22, 23, and 26 are made of tungsten (W), the barrier metal layers 22A, 23A, and 26A are made of titanium (Ti), the select line SL and the write line WR are made of copper (Cu), and the upper insulating layer 25 is made of $SiO_2$.

[Step-110]

Next, an interlayer insulating layer, a wiring, and a wiring layer are formed on the upper insulating layer 25. Thus, the uppermost layer is attached to a support substrate on the basis of a known method. Next, an exposed surface of the silicon semiconductor substrate is polished or the like on the basis of a known method, such as a CMP method, to thin the silicon semiconductor substrate. The element isolation region 11 functions as a kind of stopper at the time of thinning the silicon semiconductor substrate. In this manner, the base portion 10 formed of a part of the silicon semiconductor substrate can be obtained.

[Step-120]

Thereafter, the interlayer insulating layer 31 is formed on the second surface 10B of the base portion 10, the connection hole 32 is formed in the interlayer insulating layer 31 in a portion above the one source/drain region 15A, and the barrier metal layer 32A is formed on the inner wall and the bottom of the connection hole 32.

[Step-130]

Thereafter, the underlayer 41, the layered structure body 50A, the cap layer 54, and the connecting portion 42 are deposited on the connection hole 32, and then, the connecting portion 42, the cap layer 54, the layered structure body 50A, and the underlayer 41 are etched on the basis of a reactive ion etching method (RIE method). Note that the intermediate layer 52 made of a magnesium oxide (MgO) was formed by depositing a MgO layer on the basis of an RF magnetron sputtering method. In addition, the other layers were formed by a DC magnetron sputtering method. The respective layers can be also patterned on the basis of an ion milling method (ion beam etching method), instead of patterning each layer by the RIE method.

[Step-140]

Next, the insulating layer 33 is formed on the entire surface, and the insulating layer 33 is planarized so as to form a state where the underlayer 41, the layered structure body 50A, the cap layer 54, and the connecting portion 42 are surrounded by the insulating layer 33 and a state where a top surface of the connecting portion 42 is exposed. Thus, the bit line BL connected to the connecting portion 42 is formed on the insulating layer 33. Note that it is possible to adopt a mode in which the cap layer 54 is directly connected to the bit line BL without forming the connecting portion 42.

The interlayer insulating layer 31 is made of $SiO_2$, the insulating layer 33 is made of SiN, the connection hole 32 is made of tungsten (W), the barrier metal layer 32A is made of titanium (Ti), the underlayer 41 is made of Ta, the cap layer 54 has a layered structure of a Ta layer and a Ru layer, and the connecting portion 42 and the bit line BL are made of copper (Cu).

In this manner, the nonvolatile memory cell of the first embodiment illustrated in FIG. 1 can be obtained. Note that the interlayer insulating layer, wiring, wiring layer, and support substrate formed above (the lower side in the drawings) the upper insulating layer 25 are not illustrated in FIGS. 1, 2, and 6 to 16.

As described above, an MOS manufacturing process can be basically applied to the manufacturing of the nonvolatile memory cell of the first embodiment, and the nonvolatile memory cell can be applied as a general-purpose memory.

Note that, in some cases, the layered structure body 50A can be also formed on the interlayer insulating layer 31 by omitting the formation of the connection hole 32 and the barrier metal layer 32A in the interlayer insulating layer 31 and depositing the layered structure body 50A, the cap layer 54, and the connecting portion 42 after forming the underlayer 41 on the interlayer insulating layer 31, and then, etching the connecting portion 42, the cap layer 54, and the layered structure body 50A on the basis of a reactive ion etching method (RIE method). Alternatively, the formation of the connection hole 32 and the barrier metal layer 32A in the interlayer insulating layer 31 may be omitted, and the underlayer 41, the layered structure body 50A, and the like may be directly formed on the one source/drain region 15A.

Hereinafter, the information writing method of the nonvolatile memory cell array of the first embodiment will be described. Note that the information writing method in each of the plurality of nonvolatile memory cells arranged along the first direction will be described.

In each of the plurality of nonvolatile memory cells arranged along the first direction, first, the selection transistor TR is brought into a non-conductive state, and a current is caused to flow between the write line WR and the nonvolatile memory element 50 such that the information "1" is stored in each of the nonvolatile memory cells.

Figure 4A:
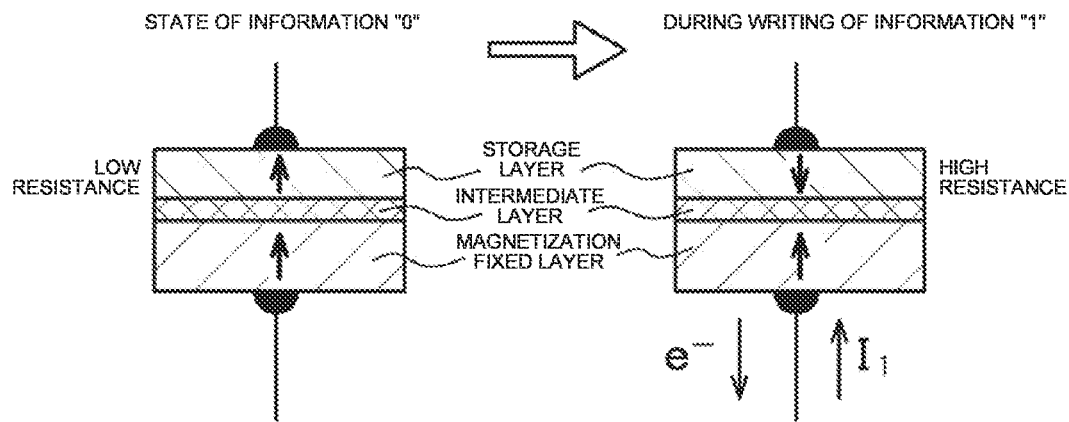
FIGS. 4A, 4B, and 4C are conceptual diagrams of a nonvolatile memory element to which magnetization reversal by spin injection is applied.
Figure 4B:
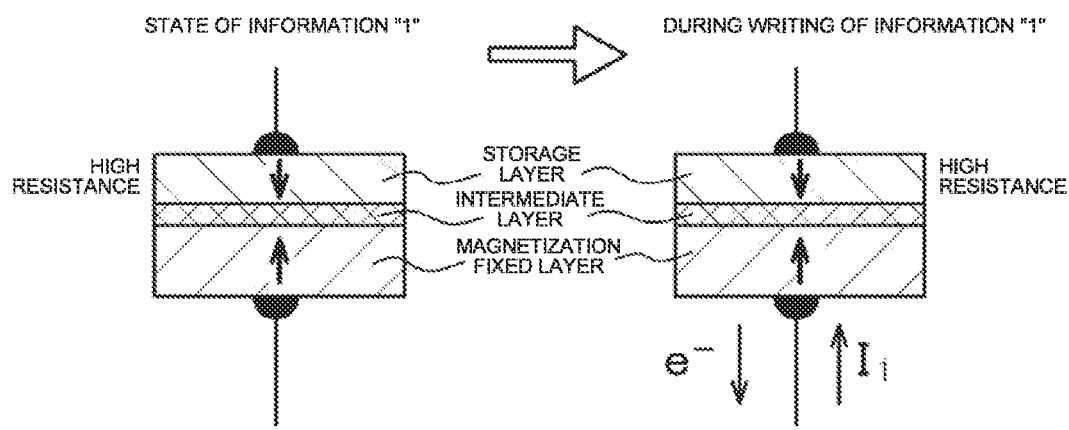
Figure 4C:
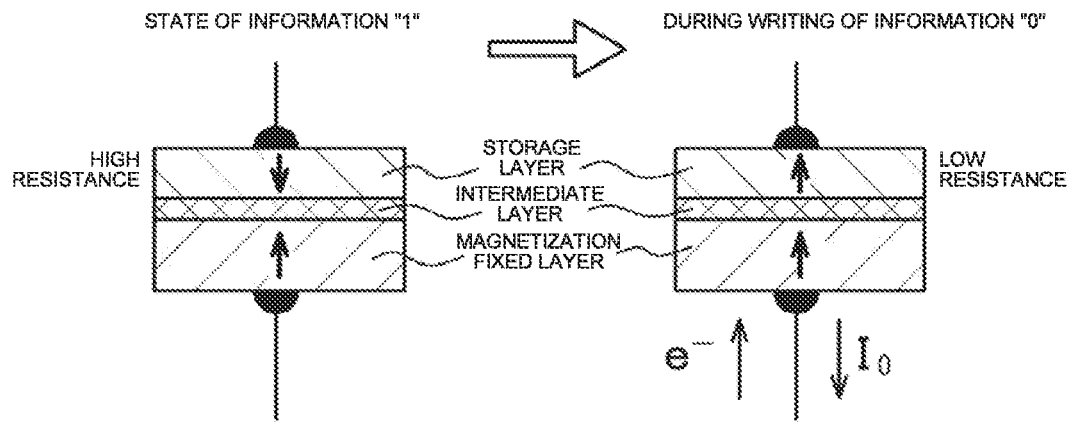
Figure 5A:
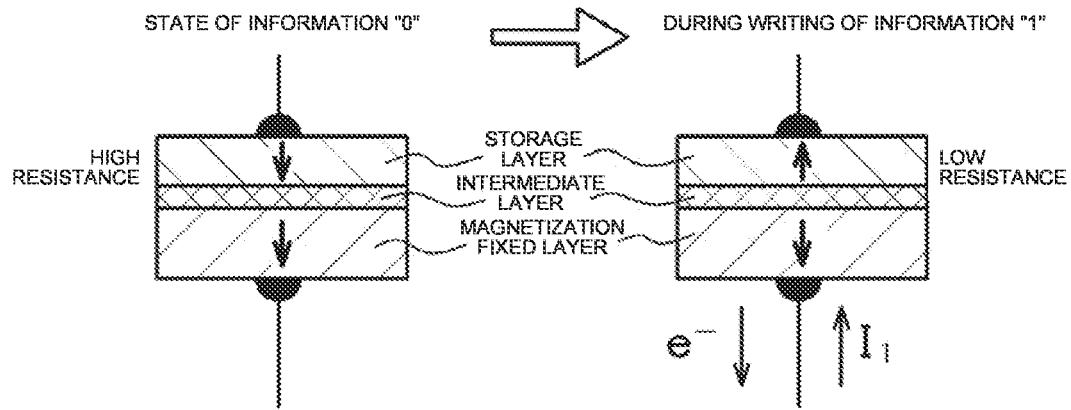
FIGS. 5A, 5B, and 5C are conceptual diagrams of a nonvolatile memory element to which magnetization reversal by spin injection is applied.

That is, it is assumed that the information "0" stored in the storage layer 53 is rewritten to "1" as illustrated in conceptual diagrams of FIGS. 4A and 5A. That is, a write current (magnetization reversal current) $I_1$ is caused to flow from the magnetization fixed layer 51 to the storage layer 53 in a parallel magnetization state. In other words, electrons flow from the storage layer 53 toward the magnetization fixed layer 51. Specifically, $V_{dd}$ is applied to the write line WR, and the bit line BL is grounded. Electrons having reached the magnetization fixed layer 51 and having a spin in one direction pass through the magnetization fixed layer 51. On the other hand, electrons having a spin in the other direction are reflected by the magnetization fixed layer 51. Thus, when such electrons enter the storage layer 53, a torque is applied to the storage layer 53 so that the magnetization state of the storage layer 53 is reversed. Here, it may be considered that the magnetization direction of the magnetization fixed layer 51 is fixed and thus is hardly reversed, but the storage layer 53 is reversed in order to preserve an angular momentum of the entire system. Note that FIGS. 4A, 4B, 4C, 5A, 5B, and 5C illustrates the magnetization fixed layer 51 located on the lower side, but the magnetization fixed layer 51 may be located on the upper side.

Figure 5B:
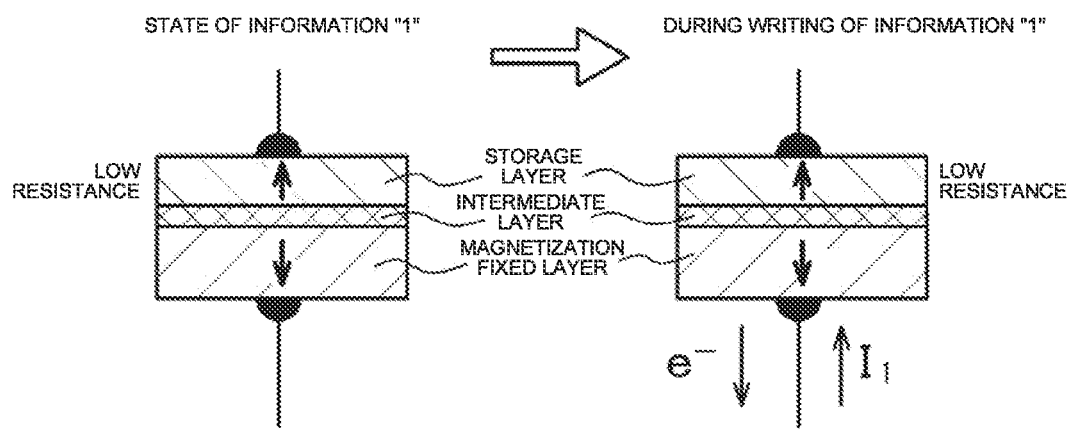

When the information "0" stored in the storage layer 53 is rewritten to "1", the information "1" stored in the storage layer 53 is not rewritten as illustrated in conceptual diagrams of FIGS. 4B and 5B.

In this manner, the information "1" can be collectively stored in each of the plurality of nonvolatile memory cells connected to the write line WR and arranged along the first direction.

Next, the write line WR is set to a floating state and a desired selection transistor TR is set to a conductive state to cause a current to flow between the select line SL and the nonvolatile memory element 50 via the other source/drain region 15B and the one source/drain region 15A of the desired selection transistor TR, thereby storing the information "0" in the nonvolatile memory cell.

Figure 5C:
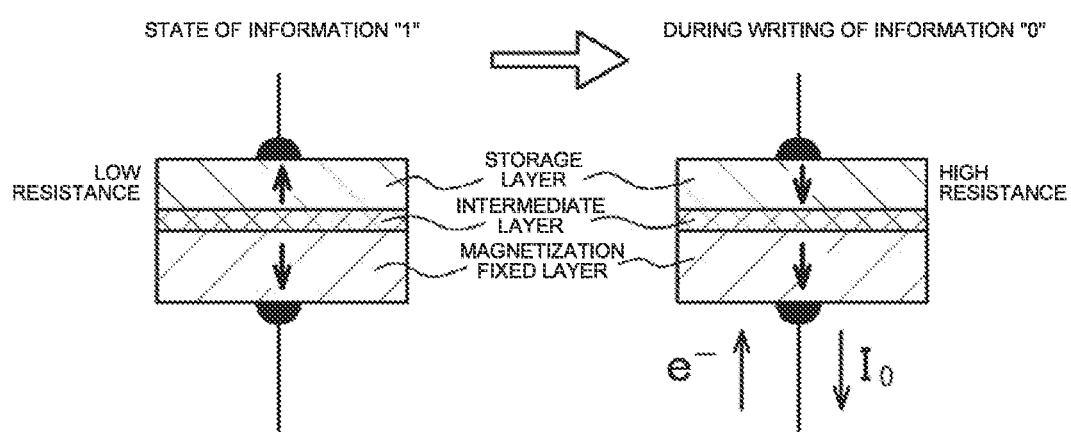

That is, the information "1" stored in the storage layer 53 is rewritten to "0" in a desired nonvolatile memory cell as illustrated in conceptual diagrams of FIGS. 4C and 5C. That is, the write current $I_0$ is cause to flow from the bit line BL to the select line SL via the storage layer 53, the magnetization fixed layer 51, and the selection transistor TR. In other words, electrons flow from the magnetization fixed layer 51 toward the storage layer 53. Specifically, for example, $V_{dd}$ is applied to the bit line BL, and the select line SL is grounded. Electrons having passed through the magnetization fixed layer 51 are spin-polarized, that is, there is a difference between the number of upward electrons and the number of downward electrons. When a thickness of the intermediate layer is sufficiently thin, and the electrons reach the storage layer 53 before reaching a non-polarized state (state in which the number of upward electrons and the number of downward electrons are the same) in a normal nonmagnetic body due to mitigation of the spin polarization, signs of a spin polarization level are reversed so that some electrons are reversed, more specifically, changed in orientations of spin angular momenta in order to decrease energy in the entire system. At this time, it is necessary to save all of the angular momenta in the system, and thus, counteraction, equivalent to the sum of changes of angular momenta caused by the electrons whose orientations have been changed, is applied to magnetic moment in the storage layer 53. Since the total number of electrons whose orientations are changed is also small in a case where the current, more specifically, the number of electrons passing through the magnetization fixed layer 51 in a unit time is small, the change in the angular momenta generated in the magnetic moment in the storage layer 53 is also small. However, when the current is increased, a large amount of changes in the angular momenta can be applied to the storage layer 53 within a unit time. A temporal change in the angular momentum is a torque. When the torque exceeds a certain threshold, the magnetic moment of the storage layer 53 starts to be reversed, and is stabilized after rotation of 180 degrees due to uniaxial anisotropy thereof. That is, the magnetization state is reversed, and the information "0" is stored in the storage layer 53.

When the information written in the storage layer 53 is read, the selection transistor TR in a nonvolatile memory cell from which the information is to be read is brought into a conductive state. Thus, a current is caused to flow between the bit line BL and the select line SL, and a potential appearing in the bit line BL is input to the other input unit of a comparator circuit (not illustrated) forming a comparison circuit (not illustrated). On the other hand, a potential from a circuit (not illustrated) that obtains a reference resistance value is input to one input unit of the comparator circuit forming the comparison circuit. Thus, in the comparison circuit, whether the potential appearing in the bit line BL is high or low is compared with the potential from the circuit for obtaining the reference resistance value as a reference, and a comparison result (information 0/1) is output from an output unit of the comparator circuit forming the comparison circuit.

Figure 2:
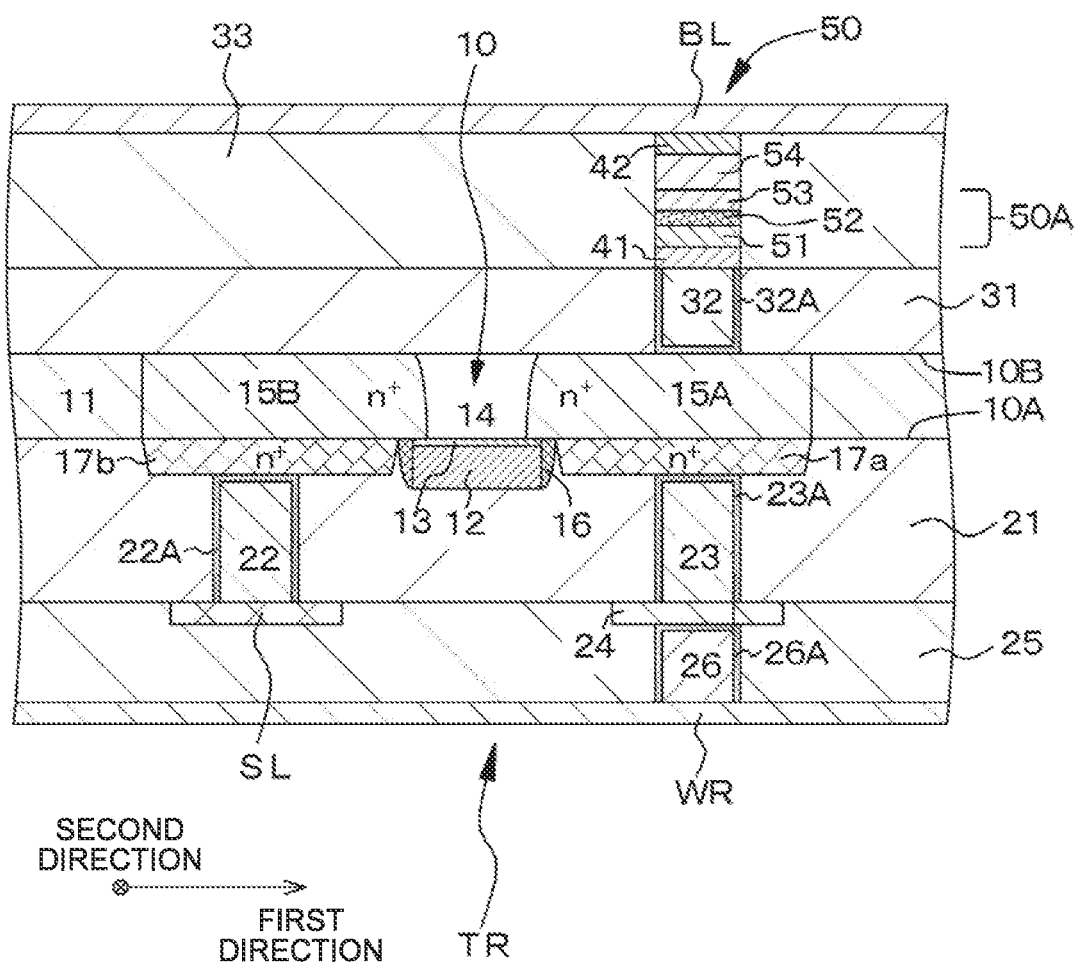
FIG. 2 is a schematic partial cross-sectional view of a modification of the nonvolatile memory cell of the first embodiment.

FIG. 2 illustrates a modification of the nonvolatile memory cell of the first embodiment. In the modification of the first embodiment, silicon layers 17a and 17b containing n-type impurities are formed on the one source/drain region 15A and the other source/drain region 15B of the selection transistor TR on the basis of an epitaxial growth method. The n-type impurities may be introduced into the silicon layers 17a and 17b on the basis of an ion implantation method, or the impurities may be doped during epitaxial growth. Since the silicon layers 17a and 17b are provided, the resistance of the source/drain region can be further reduced.

In a conventional technique, the driving capability of a selection transistor varies depending on information to be written, and the selection transistor needs to be increased in size in order to ensure an appropriate write current even in a disadvantageous state (that is, in the case of writing information "1") so that there is a problem that a cell area increases. In the nonvolatile memory cell of the first embodiment, however, a current is caused to flow from the write line to the nonvolatile memory element without passing through the selection transistor in the disadvantageous state (that is, in the case of writing the information "1"), and a current is caused to flow to the nonvolatile memory element via the selection transistor in an advantageous state (that is, in the case of writing the information "0"). Therefore, the selection transistor can be reduced in size, and the cell area can be reduced. For example, assuming that the cell area of the conventional nonvolatile memory cell is "1", the cell area of the nonvolatile memory cell of the first embodiment can be reduced to about "0.6", and the cost of the nonvolatile memory cell can be reduced. In addition, it is unnecessary to set the high voltage $V_{dd}$ to the bit line or the write line, and high reliability can be obtained.

In addition, various wirings are easily routed (designed) and a wiring pitch can be reduced by providing the selection transistor on the first surface side of the base portion and providing the nonvolatile memory element on the second surface side with the base portion as the reference. In addition, the possibility that the nonvolatile memory element is exposed to a high-temperature process is reduced in the manufacturing steps of the nonvolatile memory cell, properties of the nonvolatile memory element can be improved, and a problem regarding heat dissipation hardly occurs. In addition, when a substrate (referred to as a "first substrate" for convenience) on which a logic region including the nonvolatile memory cell array of the present disclosure is formed and a substrate (referred to as a "second substrate" for convenience) including an imaging element array on which a plurality of imaging elements are formed are bonded to each other, for example, the first substrate on a side where the selection transistor TR is formed is bonded to the second substrate, so that the nonvolatile memory cell array (nonvolatile memory element) is hardly subjected to a high temperature, and deterioration in properties of the nonvolatile memory cell array (nonvolatile memory element) can be prevented.

Second Embodiment

The second embodiment is a modification of the first embodiment, and relates to the nonvolatile memory cell of the first mode or the second mode.

In the nonvolatile memory cell of the second embodiment or the third embodiment to be described later,
one source/drain region 15A of the selection transistor TR has a rectification property,
a current flows between the write line WR and the nonvolatile memory element 50 via the one source/drain region 15A of the selection transistor TR when the selection transistor TR is not conductive, and
a current flows between the select line SL and the nonvolatile memory element 50 via the one source/drain region 15A and the other source/drain region 15B of the selection transistor TR and a current does not flow (or substantially does not flow) to the write line WR (or generation of a leakage current to the write line can be suppressed) when the selection transistor TR is conductive.

Figure 6:
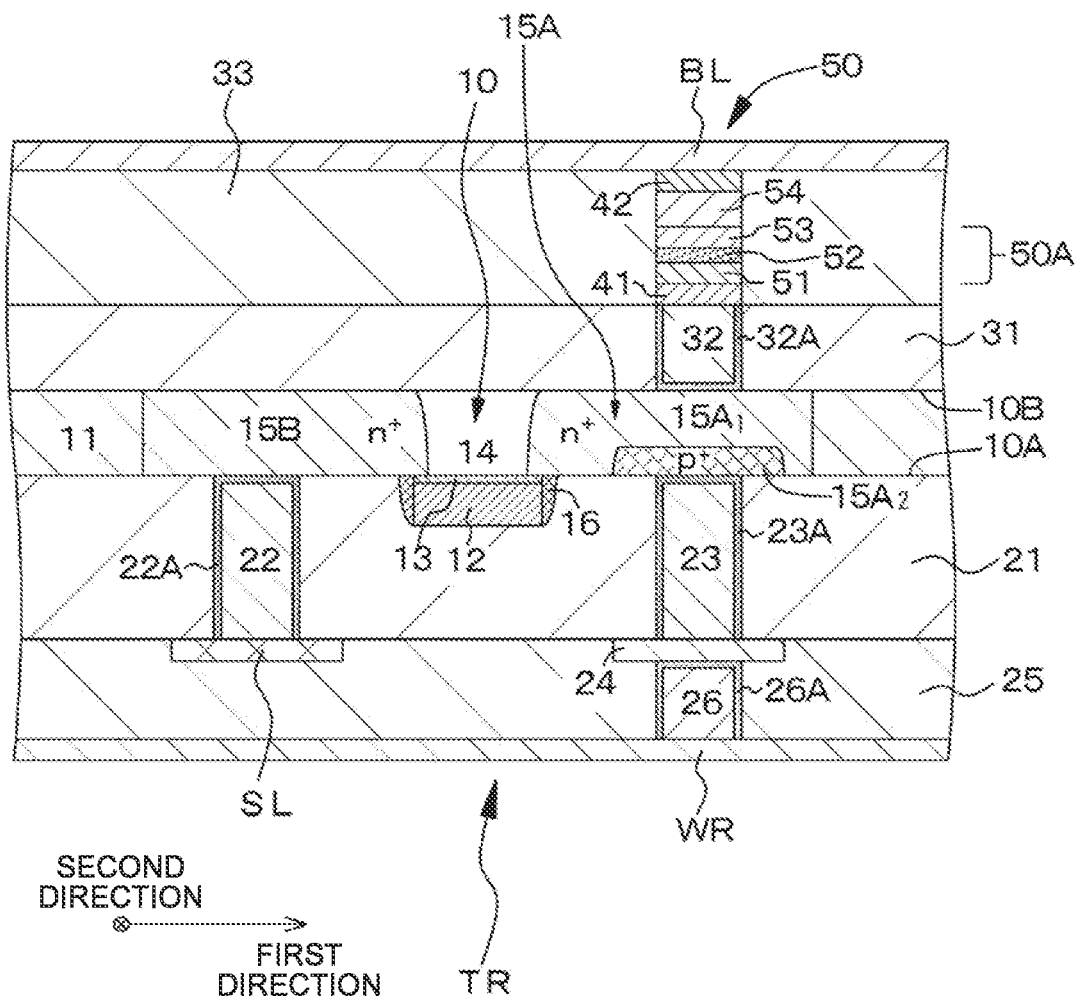
FIG. 6 is a schematic partial cross-sectional view of a nonvolatile memory cell of a second embodiment.

Thus, in the nonvolatile memory cell of the second embodiment, which is the nonvolatile memory cell of the first mode, the one source/drain region 15A of the selection transistor TR has a p/n junction as illustrated in a schematic partial cross-sectional view in FIG. 6. Specifically, the one source/drain region 15A of the selection transistor TR has a layered structure of a first layer $15A_1$ made of silicon (Si) containing an impurity of a first conductivity type (specifically, an n-type) and a second layer $15A_2$ made of silicon (Si) containing an impurity of a second conductivity type (specifically, a p-type) different from the first conductivity type. Thus, the first layer $15A_1$ is electrically connected to the nonvolatile memory element 50, and the second layer $15A_2$ is electrically connected to the write line WR. The first layer $15A_1$ and the second layer $15A_2$ are formed in the base portion 10. The first layer $15A_1$ and the second layer $15A_2$ can be formed on the basis of an ion implantation method.

Information "1" is stored in each of the nonvolatile memory cells by bringing the selection transistor TR into a non-conductive state to cause a current to flow between the write line WR and the nonvolatile memory element via the one source/drain region 15A of the selection transistor TR. At this time, $V_{dd}$ is applied to the write line WR, and the bit line BL is grounded. That is, a current $I_1$ is caused to flow from the write line WR to the bit line BL. In the one source/drain region 15A of the selection transistor TR, the current (forward current) $I_1$ can be caused to flow from the second layer $15A_2$ containing the p-type impurity to the first layer $15A_1$ containing the n-type impurity.

On the other hand, the write line WR is set to a floating state and a desired selection transistor TR is set to a conductive state to cause a current to flow between the select line SL and the nonvolatile memory element via the other source/drain region 15B and the one source/drain region 15A of the desired selection transistor TR, thereby storing the information "0" in the nonvolatile memory cell. At this time, $V_{dd}$ is applied to the bit line BL, and the select line SL is grounded. That is, a current $I_0$ is caused to flow from the bit line BL to the select line SL. The current $I_0$ is a current in an opposite direction to the write line WR. Therefore, in the one source/drain region 15A of the selection transistor TR, the current $I_0$ does not flow from the first layer $15A_1$ containing the n-type impurity to the second layer $15A_2$ containing the p-type impurity. That is, it is possible to reliably prevent the current from leaking to the write line WR, and it is possible to reliably suppress the occurrence of malfunction of the nonvolatile memory cell.

Figure 7:
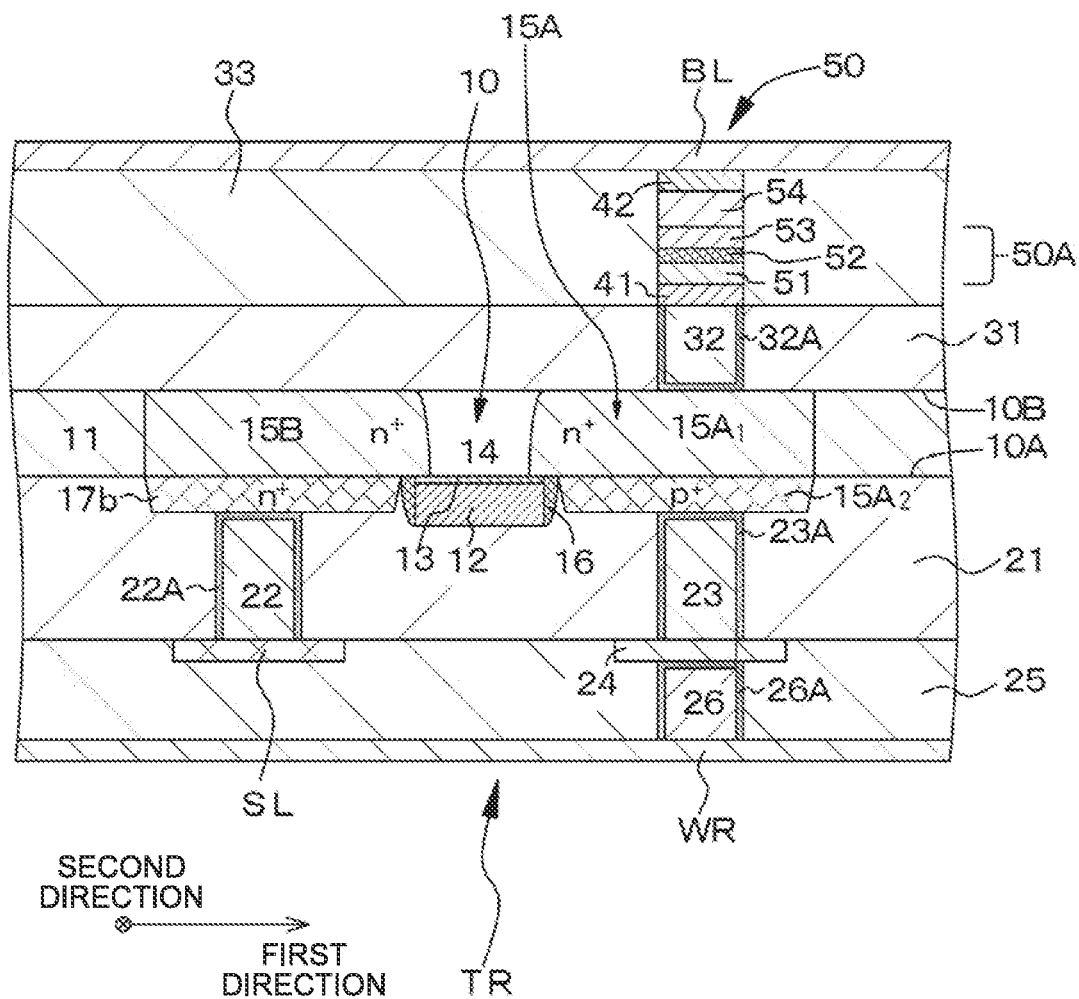
FIG. 7 is a schematic partial cross-sectional view of a modification (Modification-1) of the nonvolatile memory cell of the second embodiment.

FIG. 7 illustrates a modification (Modification-1) of the nonvolatile memory cell of the second embodiment. In Modification-1 of the second embodiment, the first layer $15A_1$ is provided in the base portion 10, and the second layer 15A$_2$ is made of a silicon (Si) containing a p-type impurity and is formed on the first layer 15A$_1$ made of silicon containing an n-type impurity on the basis of an epitaxial growth method. In addition, the silicon layer 17b containing an n-type impurity is formed on the other source/drain region 15B of the selection transistor TR on the basis of an epitaxial growth method. The impurities may be introduced into the second layer 15A$_2$ and the silicon layer 17b on the basis of an ion implantation method, or the impurities may be doped during epitaxial growth.

Figure 8:
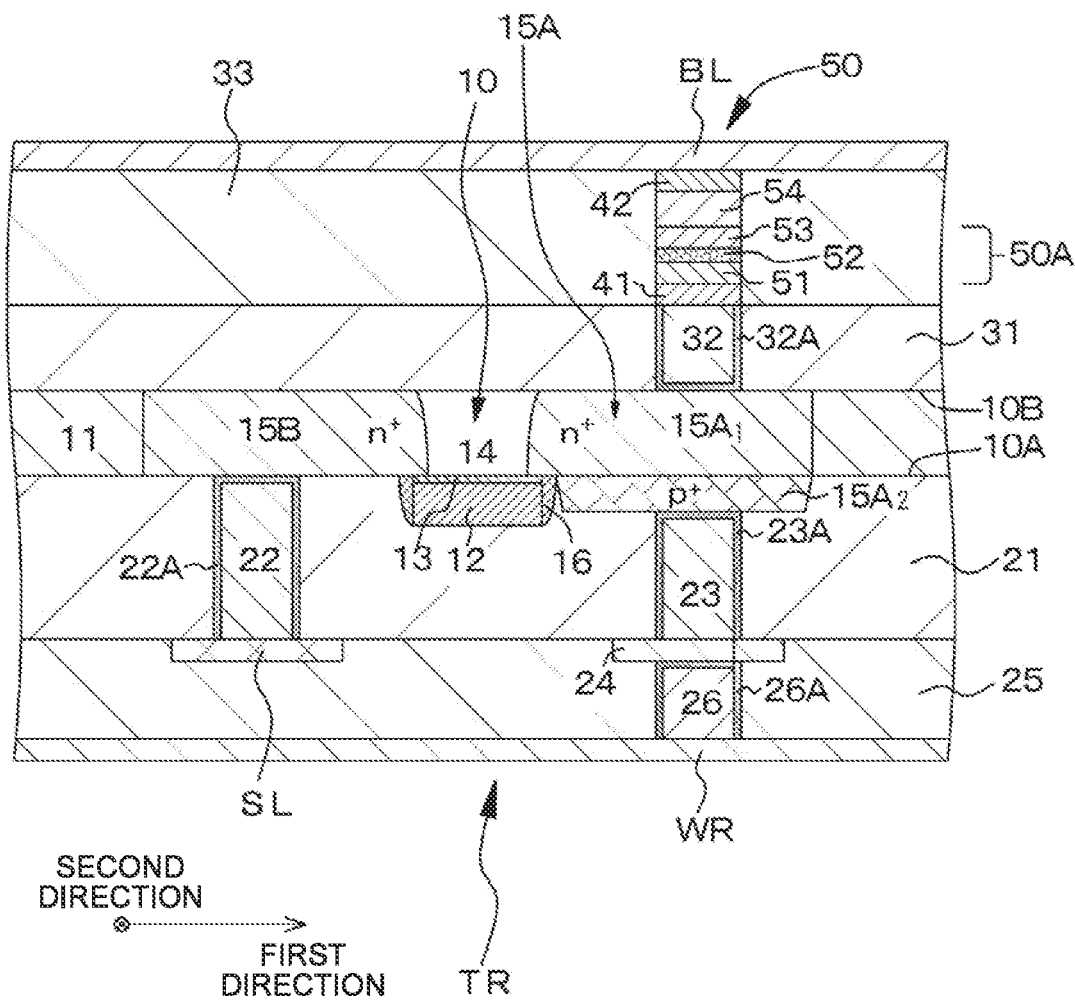
FIG. 8 is a schematic partial cross-sectional view of a modification (Modification-2) of the nonvolatile memory cell of the second embodiment.

FIG. 8 illustrates another modification (Modification-2) of the nonvolatile memory cell of the second embodiment. In Modification-2 of the second embodiment, which is the nonvolatile memory cell of the second mode, the one source/drain region 15A of the selection transistor TR has a layered structure of the first layer 15A$_1$, which is provided in the base portion 10 and made of silicon (Si) containing an impurity (specifically, n-type impurity) of a first conductivity type, and the second layer 15A$_2$ which is formed by an epitaxial growth method and made of germanium (Ge) or silicon-germanium (Si—Ge) containing an impurity (specifically, p-type impurity) of a second conductivity type different from the first conductivity type. Thus, the first layer 15A$_1$ is electrically connected to the nonvolatile memory element 50, and the second layer 15A$_2$ is electrically connected to the write line WR. A layer made of germanium (Ge) or silicon-germanium (Si—Ge) is not formed on the other source/drain region 15B of the selection transistor TR.

Except for the above points, configurations and structures of the nonvolatile memory cell and the nonvolatile memory cell array of the second embodiment can be made similar to the configurations and structures of the nonvolatile memory cell and the nonvolatile memory cell array of the first embodiment, and thus, detailed descriptions thereof will be omitted. Since the one source/drain region of the selection transistor has the p/n junction in the nonvolatile memory cell of the second embodiment, the current can flow from the write line to the bit line, but the flow of the current from the bit line to the write line is inhibited, so that the current can be reliably prevented from leaking to the write line, and the occurrence of malfunction of the nonvolatile memory cell can be reliably suppressed.

Third Embodiment

The third embodiment is a modification of the second embodiment, and relates to the nonvolatile memory cell of the third mode or the fourth mode.

Figure 9:
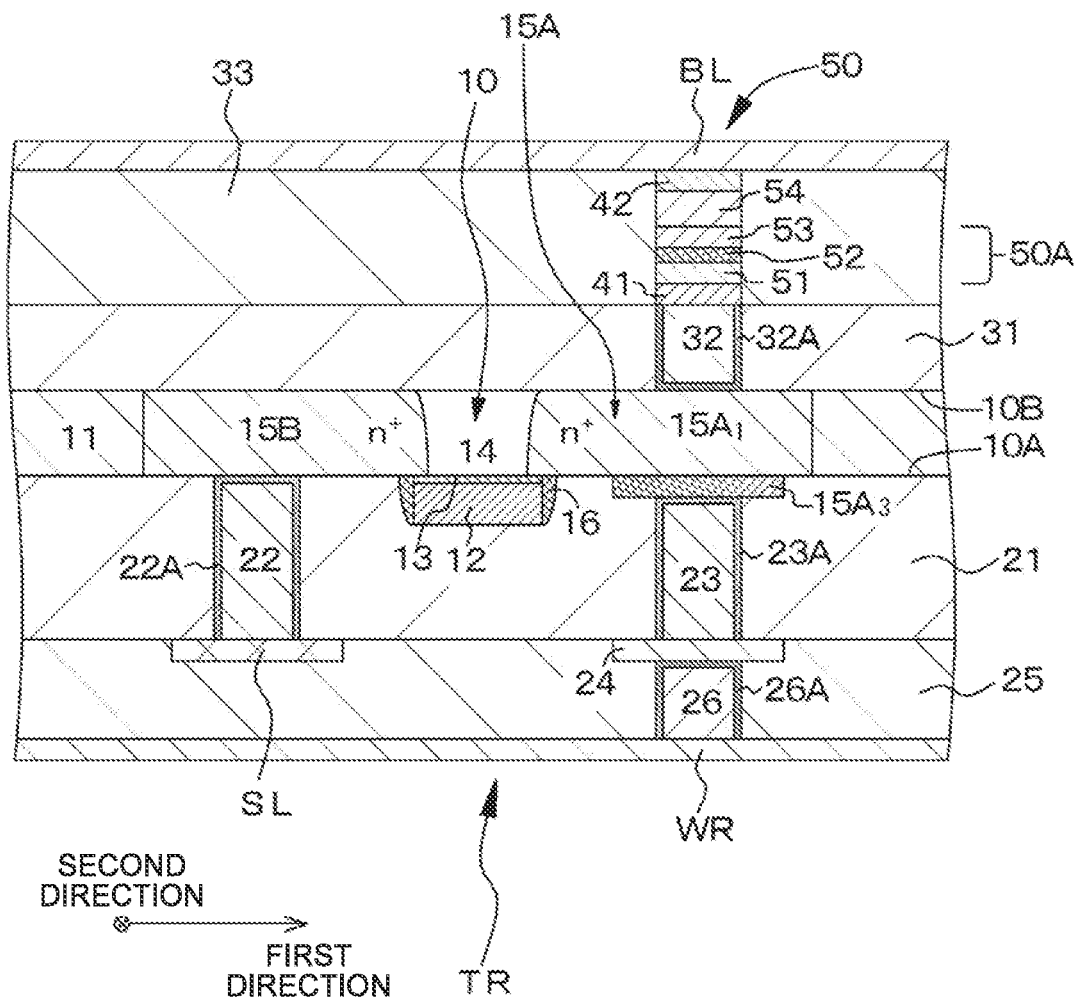
FIG. 9 is a schematic partial cross-sectional view of a nonvolatile memory cell of a third embodiment.

In the nonvolatile memory cell of the third embodiment, which is the nonvolatile memory cell of the third mode, the one source/drain region 15A of the selection transistor TR has a Schottky junction as illustrated in a schematic partial cross-sectional view in FIG. 9. Specifically, the one source/drain region 15A of the selection transistor TR has a layered structure of the first layer 15A$_1$ made of silicon (Si) containing an impurity (specifically, n-type impurity) and a second layer 15A$_3$ made of metal (specifically, for example, aluminum (Al)). Thus, the first layer 15A$_1$ is electrically connected to the nonvolatile memory element 50, and the second layer 15A$_3$ is electrically connected to the write line WR. The first layer 15A$_1$ is formed in the base portion 10, and the second layer 15A$_3$ is formed on the base portion 10. The second layer 15A$_3$ can be formed by a known method.

Information "1" is stored in each of the nonvolatile memory cells by bringing the selection transistor TR into a non-conductive state to cause a current to flow between the write line WR and the nonvolatile memory element via the one source/drain region 15A of the selection transistor TR. At this time, V$_{dd}$ is applied to the write line WR, and the bit line BL is grounded. That is, a current I$_1$ is caused to flow from the write line WR to the bit line BL. In the one source/drain region 15A of the selection transistor TR, the current (forward current) I$_1$ can be caused to flow from the second layer 15A$_3$ to the first layer 15A$_1$ containing the n-type impurity.

On the other hand, the write line WR is set to a floating state and a desired selection transistor TR is set to a conductive state to cause a current to flow between the select line SL and the nonvolatile memory element via the other source/drain region 15B and the one source/drain region 15A of the desired selection transistor TR, thereby storing the information "0" in the nonvolatile memory cell. At this time, V$_{dd}$ is applied to the bit line BL, and the select line SL is grounded. That is, a current I$_0$ is caused to flow from the bit line BL to the select line SL. The current I$_0$ is a current in an opposite direction to the write line WR. Therefore, in the one source/drain region 15A of the selection transistor TR, the current I$_0$ does not flow from the first layer 15A$_1$ containing the n-type impurity to the second layer 15A$_3$. That is, it is possible to reliably prevent the current from leaking to the write line WR, and it is possible to reliably suppress the occurrence of malfunction of the nonvolatile memory cell.

Figure 10:
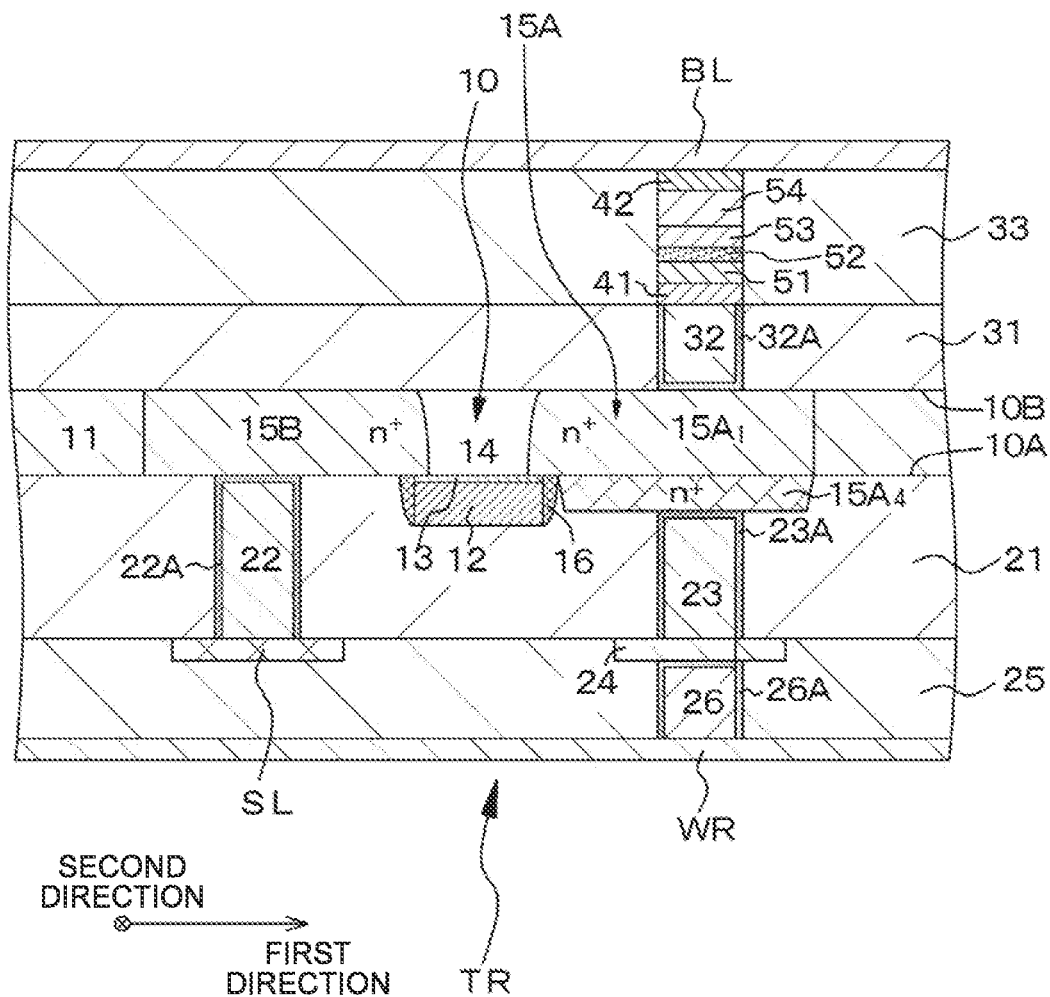
FIG. 10 is a schematic partial cross-sectional view of a modification of the nonvolatile memory cell of the third embodiment.

FIG. 10 illustrates a modification (Modification-1) of the nonvolatile memory cell of the third embodiment. In Modification-1 of the third embodiment, which is the nonvolatile memory cell of the fourth mode, the one source/drain region 15A of the selection transistor TR has a layered structure of the first layer 15A$_1$ made of silicon (Si) containing an impurity and a second layer 15A$_4$ made of germanium (Ge) or silicon-germanium (Si—Ge) containing an impurity. The first layer 15A$_1$ and the second layer 15A$_4$ contain n-type impurities. The second layer 15A$_4$ is formed on the basis of an epitaxial growth method, and the n-type impurities may be introduced into the second layer 15A$_4$ on the basis of an ion implantation method or may be doped during epitaxial growth. The barrier metal layer 23A made of Ti is formed on the inner wall and the bottom of the connection hole 23. Therefore, a Schottky junction is formed between the second layer 15A$_4$ made of germanium (Ge) or silicon-germanium (Si—Ge) containing the n-type impurity and the barrier metal layer 23A made of Ti.

Except for the above points, configurations and structures of the nonvolatile memory cell and the nonvolatile memory cell array of the third embodiment can be made similar to the configurations and structures of the nonvolatile memory cell and the nonvolatile memory cell array of the second embodiment, and thus, detailed descriptions thereof will be omitted. Since the one source/drain region of the selection transistor has the Schottky junction in the nonvolatile memory cell of the third embodiment, the current can flow from the write line to the bit line, but the flow of the current from the bit line to the write line is inhibited, so that the current can be reliably prevented from leaking to the write line, and the occurrence of malfunction of the nonvolatile memory cell can be reliably suppressed.

Fourth Embodiment

Figure 11:
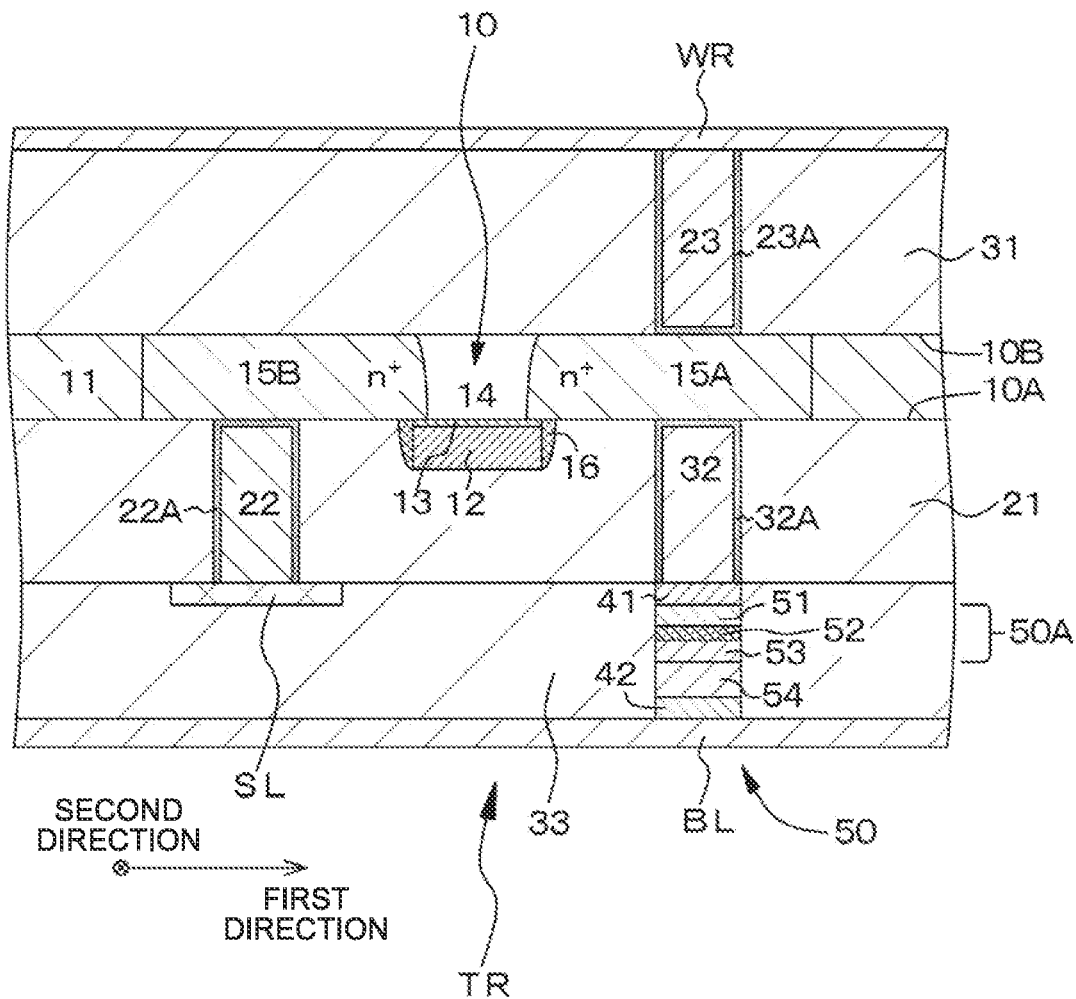
FIG. 11 is a schematic partial cross-sectional view of a nonvolatile memory cell of a fourth embodiment.

The fourth embodiment corresponds modifications of the nonvolatile memory cell and the nonvolatile memory cell array of the first to third embodiments. As illustrated in FIG. 11 which is a schematic partial cross-sectional view of a nonvolatile memory cell of the fourth embodiment obtained by modifying the nonvolatile memory cell of the first embodiment illustrated in FIG. 1, the selection transistor TR and the nonvolatile memory element 50 are provided on the first surface 10A side of the base portion 10 made of a semiconductor material, and the write line WR is provided on the second surface 10B side opposing the first surface 10A of the base portion 10, in the nonvolatile memory cell of the fourth embodiment.

Hereinafter, a method for manufacturing the nonvolatile memory cell of the fourth embodiment will be described.

[Step-400]

First, the element isolation region 11 is formed on a silicon semiconductor substrate on the basis of a known method, and the selection transistor TR, formed of the gate insulating layer 13, the gate electrode 12, the gate sidewall 16, and the source/drain regions 15A and 15B, is formed in a portion of the silicon semiconductor substrate surrounded by the element isolation region 11. A portion of the silicon semiconductor substrate located between the source/drain region 15A and the source/drain region 15B corresponds to the channel formation region 14. Next, the lower insulating layer 21, the connection holes 22 and 32, the barrier metal layers 22A and 32A, and the select line SL are formed.

[Step-410]

Next, the underlayer 41, the layered structure body 50A, the cap layer 54, and the connecting portion 42 are deposited on the connection hole 32, and then, the connecting portion 42, the cap layer 54, the layered structure body 50A, and the underlayer 41 are etched on the basis of a reactive ion etching method (RIE method).

[Step-420]

Next, the insulating layer 33 is formed on the entire surface, and the insulating layer 33 is planarized so as to form a state where the underlayer 41, the layered structure body 50A, the cap layer 54, and the connecting portion 42 are surrounded by the insulating layer 33 and a state where a top surface of the connecting portion 42 is exposed. Thus, the bit line BL connected to the connecting portion 42 is formed on the insulating layer 33.

[Step-430]

Thereafter, an interlayer insulating layer, a wiring, and a wiring layer are formed on the insulating layer 33 and the bit line BL. Thus, the uppermost layer is attached to a support substrate on the basis of a known method. Next, an exposed surface of the silicon semiconductor substrate is polished or the like on the basis of a known method to thin the silicon semiconductor substrate. The element isolation region 11 functions as a kind of stopper at the time of thinning the silicon semiconductor substrate. In this manner, the base portion 10 formed of a part of the silicon semiconductor substrate can be obtained.

[Step-440]

Thereafter, the interlayer insulating layer 31 is formed on the second surface 10B of the base portion 10, the connection hole 23 is formed in the interlayer insulating layer 31 in a portion above the one source/drain region 15A, and the barrier metal layer 23A is formed on the inner wall and the bottom of the connection hole 23. Thus, the write line WR connected to the connection hole 23 is formed on the interlayer insulating layer 31.

In this manner, the nonvolatile memory cell of the first embodiment illustrated in FIG. 11 can be obtained.

Figure 12:
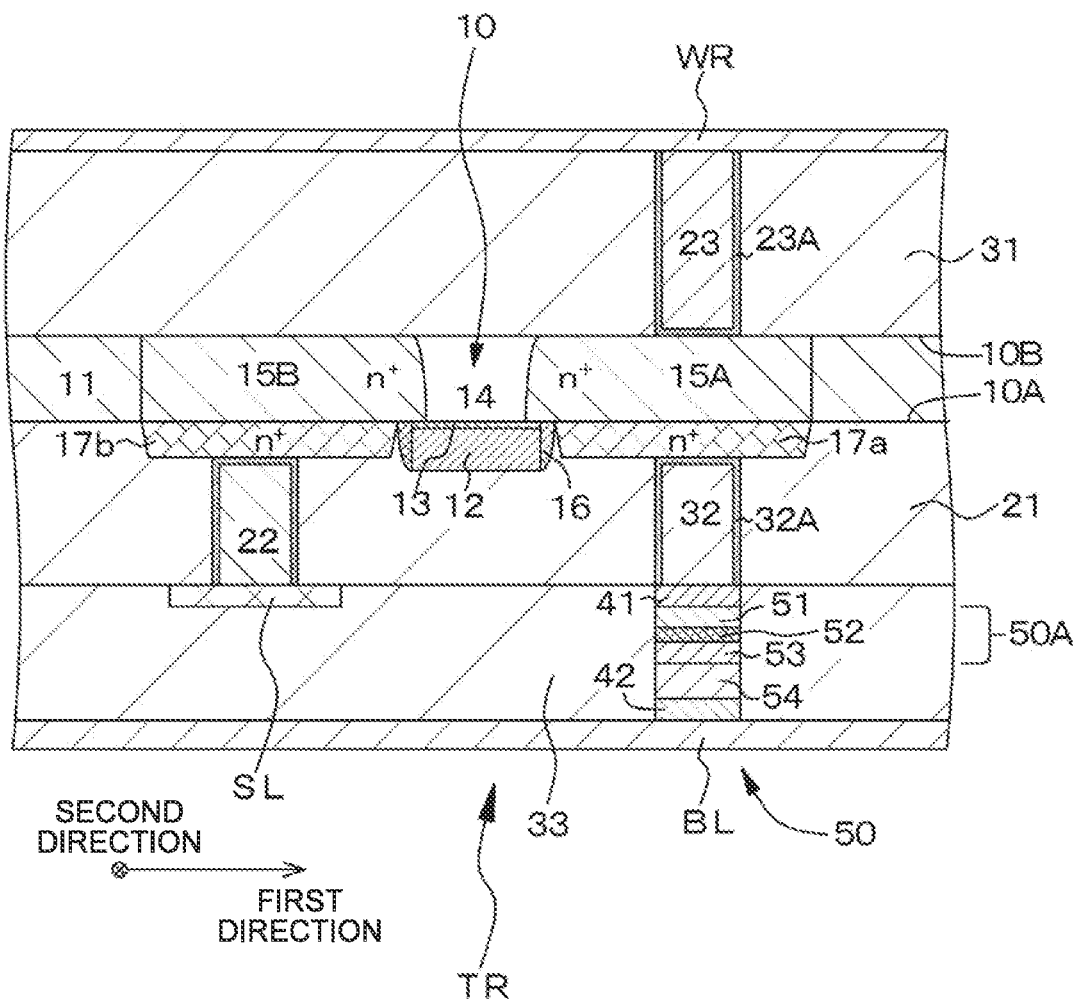
FIG. 12 is a schematic partial cross-sectional view of a modification (Modification-1) of the nonvolatile memory cell of the fourth embodiment.
Figure 13:
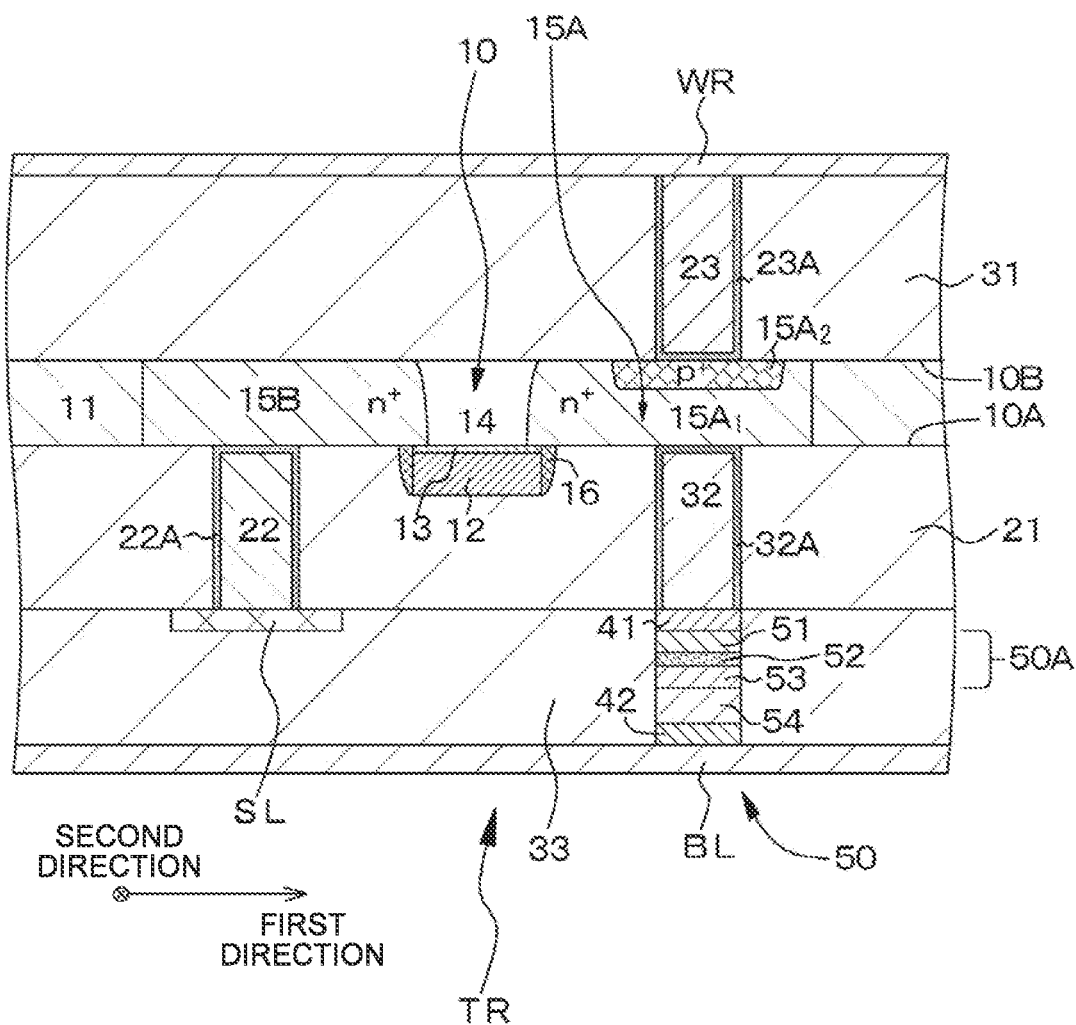
FIG. 13 is a schematic partial cross-sectional view of a modification (Modification-2) of the nonvolatile memory cell of the fourth embodiment.
Figure 14:
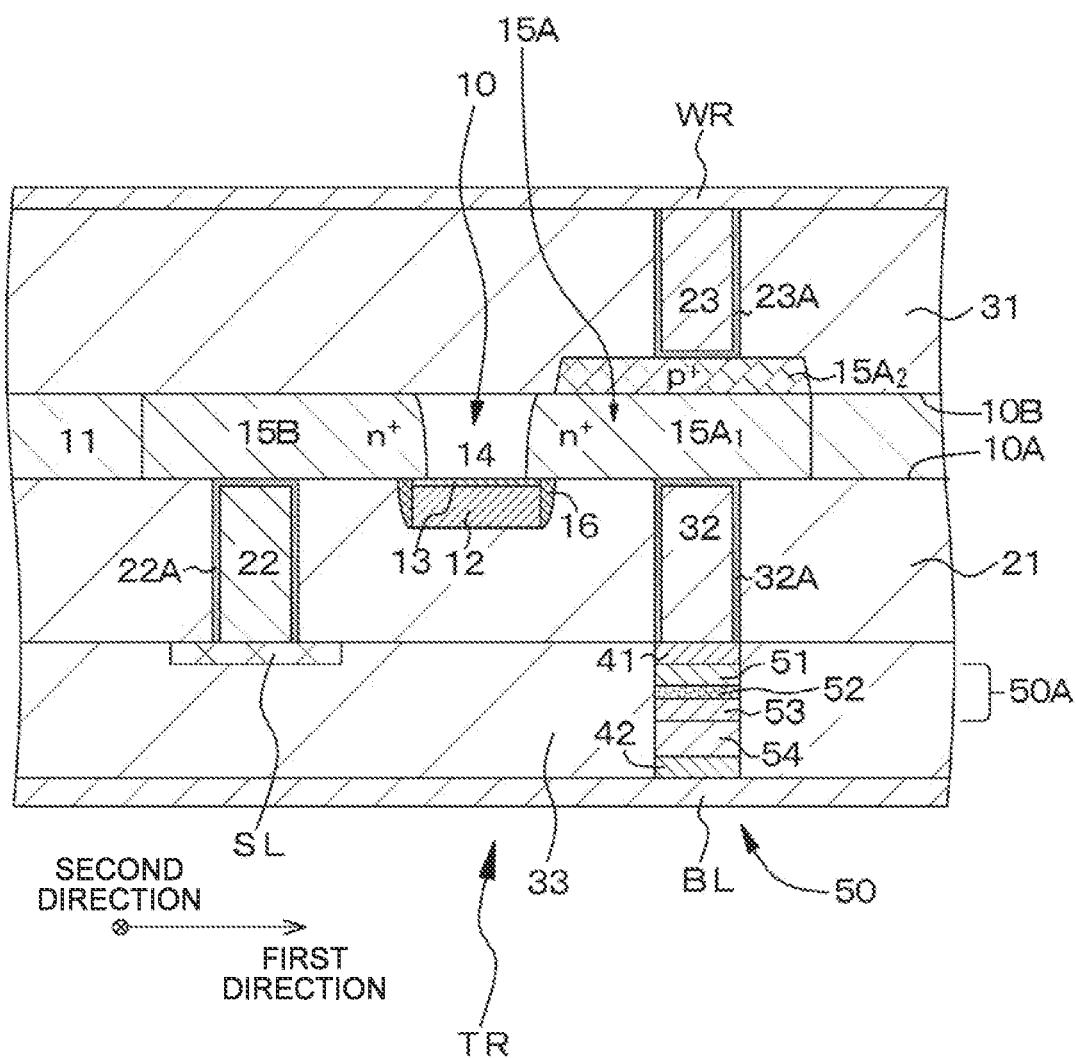
FIG. 14 is a schematic partial cross-sectional view of a modification (Modification-3) of the nonvolatile memory cell of the fourth embodiment.
Figure 15:
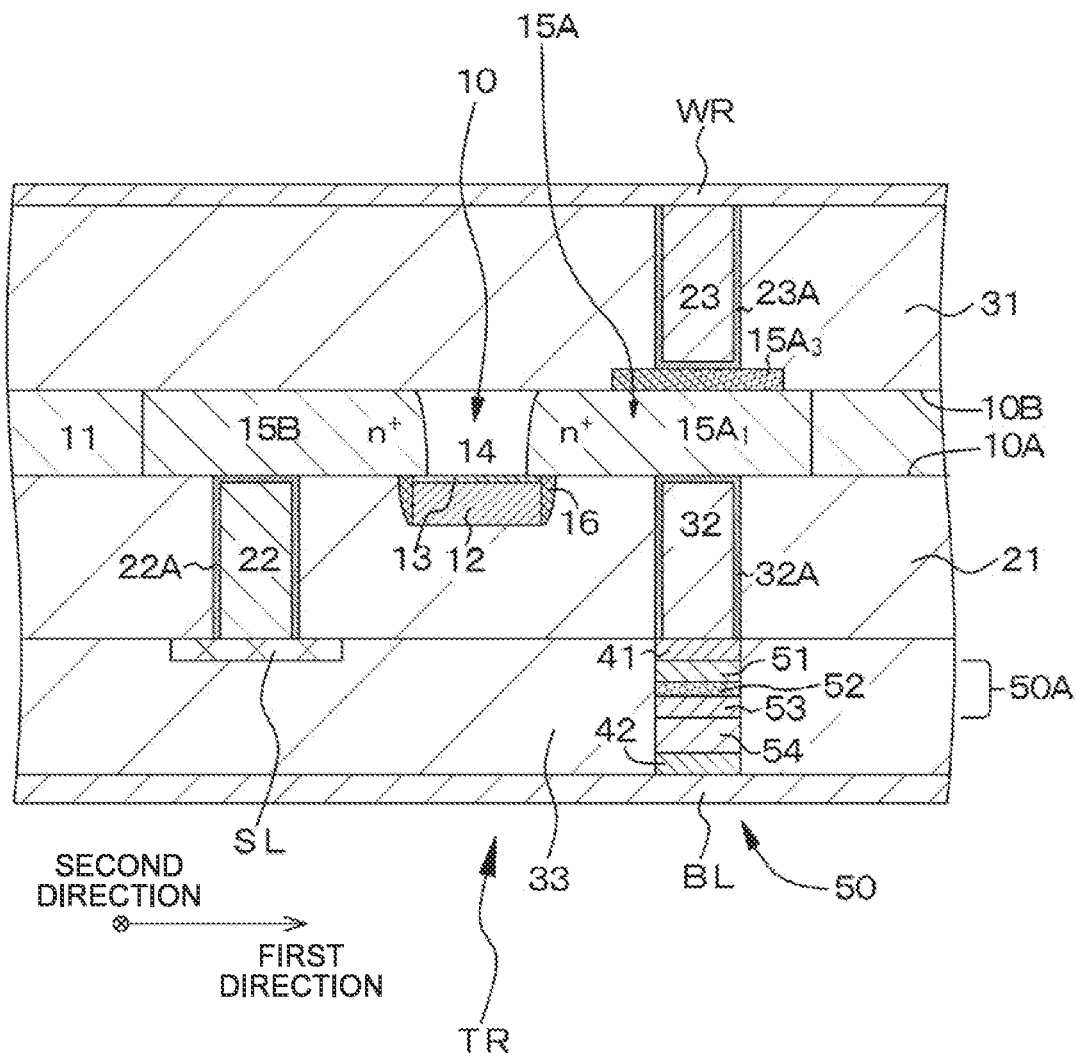
FIG. 15 is a schematic partial cross-sectional view of a modification (Modification-4) of the nonvolatile memory cell of the fourth embodiment.
Figure 16:
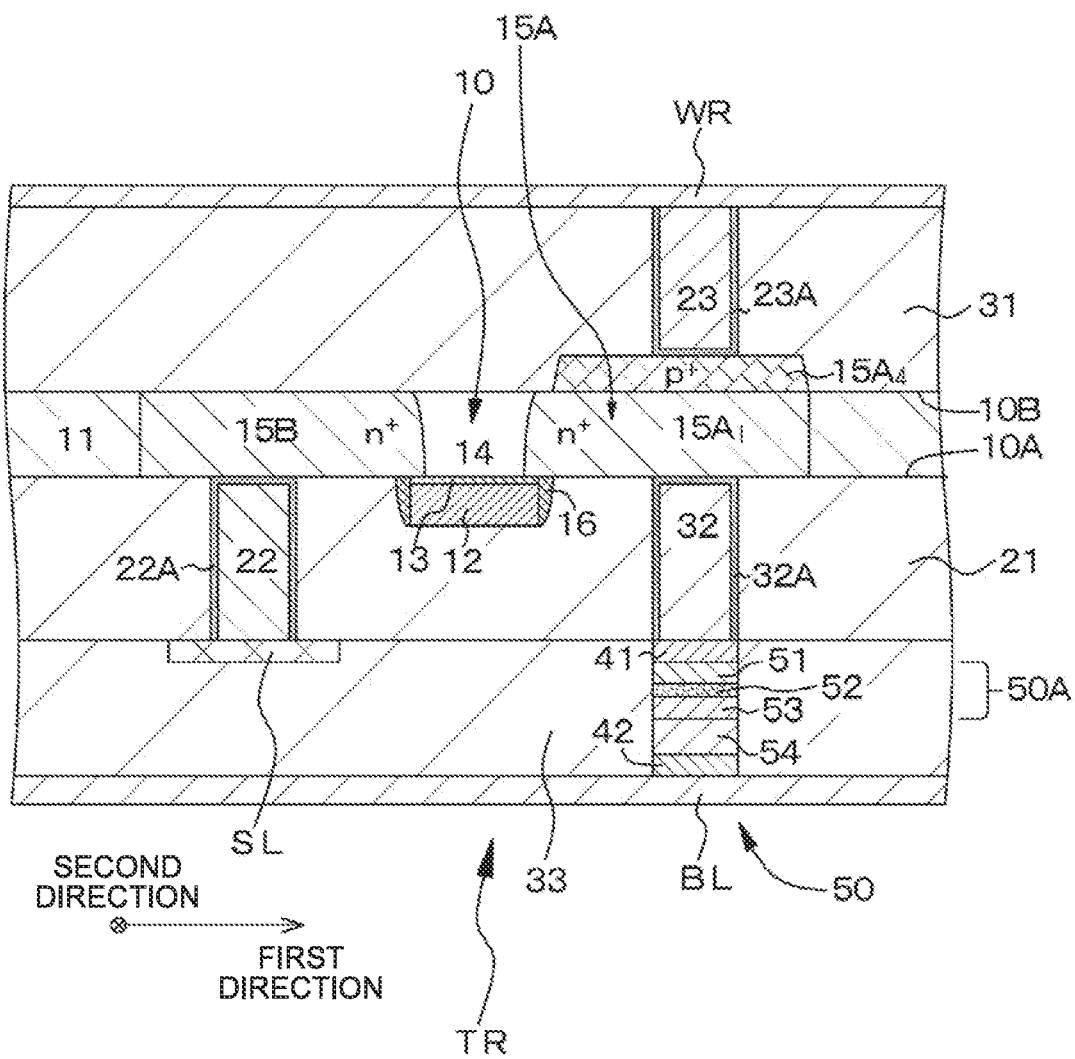
FIG. 16 is a schematic partial cross-sectional view of a modification (Modification-5) of the nonvolatile memory cell of the fourth embodiment.

FIG. 12 illustrates a schematic partial cross-sectional view of a nonvolatile memory cell of the fourth embodiment obtained by modifying the modification of the nonvolatile memory cell of the first embodiment illustrated in FIG. 2. In addition, FIG. 13 illustrates a schematic partial cross-sectional view of a nonvolatile memory cell of the fourth embodiment obtained by modifying the nonvolatile memory cell of the second embodiment illustrated in FIG. 6; FIG. 14 illustrates a schematic partial cross-sectional view of a nonvolatile memory cell of the fourth embodiment obtained by modifying the modification of the nonvolatile memory cell of the second embodiment illustrated in FIG. 8; FIG. 15 illustrates a schematic partial cross-sectional view of a nonvolatile memory cell of the fourth embodiment obtained by modifying the nonvolatile memory cell of the third embodiment illustrated in FIG. 9; and FIG. 16 illustrates a schematic partial cross-sectional view of a nonvolatile memory cell of the fourth embodiment obtained by modifying the modification of the nonvolatile memory cell of the third embodiment illustrated in FIG. 10.

Except for the above points, configurations and structures of the nonvolatile memory cell and the nonvolatile memory cell array of the fourth embodiment can be made similar to the configurations and structures of the nonvolatile memory cell and the nonvolatile memory cell array of the first to third embodiments, and thus, detailed descriptions thereof will be omitted.

Fifth Embodiment

Figure 17A:
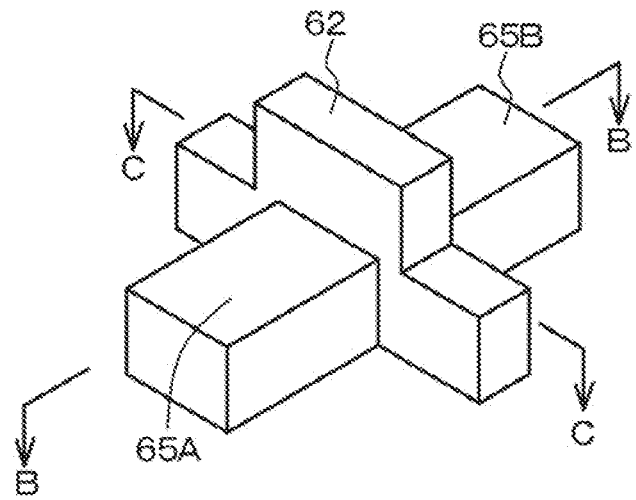
FIG. 17A is a schematic perspective view of a Fin-FET forming a nonvolatile memory cell of a fifth embodiment.
Figure 17B:
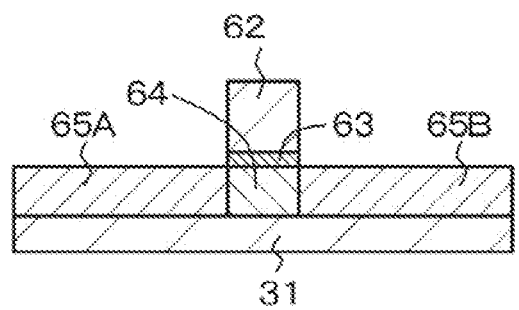
FIGS. 17B and 17C are schematic partial cross-sectional views of the Fin-FET forming the nonvolatile memory cell of the fifth embodiment along arrows B-B and C-C in FIG. 17A, respectively.
Figure 17C:
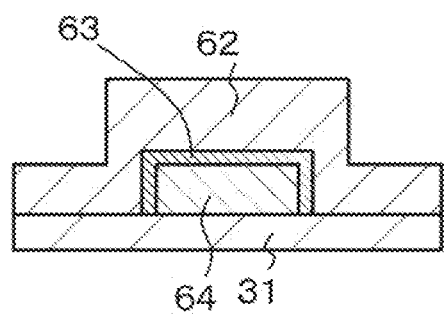

The fifth embodiment corresponds to modifications of the first to fourth embodiments. In the fifth embodiment, the selection transistor TR is formed of a Fin-FET. FIG. 17A illustrates a schematic perspective view of the selection transistor TR in the fifth embodiment; FIG. 17B illustrates a schematic partial cross-sectional view along an arrow B-B in FIG. 17A; and FIG. 17C illustrates a schematic partial cross-sectional view along an arrow C-C in FIG. 17A. The selection transistor TR in the fifth embodiment includes a base portion 60 formed of a kind of rod-shaped semiconductor layer (for example, silicon layer) having a rectangular cross-sectional shape, and the base portion 60 is formed on the interlayer insulating layer 31, for example. Thus, a gate electrode 62 is formed on both side surfaces and a top surface of a portion located at the center of the base portion 60 via a gate insulating layer 63, and a portion of the base portion 60 surrounded by the gate electrode 62 corresponds to a channel formation region 64. Regions of the base portion 60 on both sides of the channel formation region 64 correspond to one source/drain region 65A and the other source/drain region 65.

Such a Fin-FET may be applied to the selection transistor TR described in the first embodiment to the fourth embodiment. Except for the above points, configurations and structures of the nonvolatile memory cell and the nonvolatile memory cell array of the fifth embodiment can be made similar to the configurations and structures of the nonvolatile memory cell and the nonvolatile memory cell array of the first to fourth embodiments, and thus, detailed descriptions thereof will be omitted.

The nonvolatile memory cell, the nonvolatile memory cell array, and the information writing method of the nonvolatile memory cell array of the present disclosure have been described above based on the preferred embodiments, but the present disclosure is not limited to these embodiments. The configurations, structures, various layered structures, used materials, and the like of the nonvolatile memory cell and the nonvolatile memory cell array described in the embodiments are examples, and can be appropriately changed.

The magnetization fixed layer 51 may have a layered ferri-structure (layered ferri-pinned structure) including a reference layer and a fixed layer. A substrate (first substrate) on which a logic region including the nonvolatile memory cell array of the present disclosure is formed and, for example, a substrate (second substrate) including an imaging element array on which a plurality of imaging elements are formed can also be bonded to each other. In such a case, the nonvolatile memory cell array (nonvolatile memory element) is hardly subjected to the high temperature by bonding the first substrate on the side where the selection transistor TR is formed to the second substrate, and deterioration in properties of the nonvolatile memory cell array (nonvolatile memory element) can be prevented.

The selection transistor TR has been described as the n-channel transistor exclusively, but may be a p-channel transistor. Note that, in this case, in the nonvolatile memory cell of the first mode or the second mode according to the second embodiment, the first conductivity type may be p-type, the second conductivity type may be n-type, the first layer may be connected to one end of the nonvolatile memory element 50, and the second layer may be connected to the write line WR. In addition, in the nonvolatile memory cell of the third mode according to the third embodiment, the conductivity type of the impurity may be p-type, and in this case, indium (In) and tin (Sn) can be exemplified as the metal. In addition, in the nonvolatile memory cell of the fourth mode, the conductivity type of the impurity may be p-type, and examples of the material forming the barrier metal layer include aluminum (Al) and titanium (Ti).

In the nonvolatile memory cell of the first embodiment illustrated in FIG. 1, it is also possible to adopt a mode in which the formation of the write line WR, the upper insulating layer 25, the connection hole 26, the barrier metal layer 26A, and the contact portion 24 is omitted, the write line WR extending in the first direction is formed on the interlayer insulating layer 31, and the underlayer 41, the layered structure body 50A, and the like are formed on the write line WR.

In addition, in the nonvolatile memory cell of the fourth embodiment illustrated in FIG. 11, it is also possible to adopt a mode in which the formation of the write line WR, the interlayer insulating layer 31, the connection hole 23, and the barrier metal layer 23A is omitted, the write line WR extending in the first direction is formed on the lower insulating layer 21 (or on the upper insulating layer formed on the lower insulating layer 21), and the underlayer 41, the layered structure body 50A, and the like are formed on the write line WR without thinning the silicon semiconductor substrate.

Although the base portion obtained by thinning the silicon semiconductor substrate is used in the embodiments, but the base portion may alternatively be formed of an SOI substrate (specifically, a silicon layer forming an SOI substrate or the like). Alternatively, the base portion may be formed of an InGaAs layer or a Ge layer, instead of the silicon layer, and the selection transistor TR may be formed on the InGaAs layer or the Ge layer.

In the embodiments, the nonvolatile memory element has been exclusively described based on the spin transfer torque-based magnetic random access memory of the perpendicular magnetization type, but the nonvolatile memory element is not limited thereto. For example, (A) a phase-change nonvolatile memory element (Phase Change RAM (PCRAM)), (B) a tunnel magnetoresistive effect element using a TMR effect, (C) a ferroelectric nonvolatile semiconductor memory element using a ferroelectric material (Ferroelectric Random Access Memory (FeRAM)), (D) a nonvolatile memory element including an inter-electrode material layer provided between electrodes and an redox-active substance that can serve as an electrode reaction inhibition layer depending on a voltage application state between the electrodes such that the electrode reaction inhibition layer is formed or eliminated along an interface region between the electrode and the inter-electrode material layer according to the voltage application state between the electrodes, or an area of the electrode reaction inhibition layer is increased or decreased, (E) a carbon nanotube memory element (a carbon nanotube, one forming a memory element by itself, and those in which wirings and electrodes in various nonvolatile memory cells (various nonvolatile memory elements) are formed by carbon nanotubes), (F) an organic thin-film memory element (one using an organic material for an organic compound layer that stores information), and (G) a spin transfer torque-based magnetic random access memory of an in-plane magnetization type can be exemplified. Configurations and structures of these nonvolatile memory elements can adopt well-known configurations and structures.

A phase-change nonvolatile memory element has a structure in which a resistance change layer functioning as a memory unit is arranged between two electrodes. Here, information is stored in the resistance change layer as an electric resistance value (hereinafter, may be simply referred to as a "resistance value") changes. Thus, in this case, the phase-change (resistance-change) nonvolatile memory element can adopt (a) a mode including a resistance change layer formed of an ion conductor containing metal, (b) a mode including a resistance change layer having a layered structure of a high-resistance layer and an ion source layer (ion supply source layer), (c) a mode including a resistance change layer made of a chalcogenide-based material, (d) a mode including a resistance change layer made of a material having a Colossal Electro-Resistance effect (CER effect), or (e) a mode including a resistance change layer made of a material having a Colossal magneto-resistance effect (CMR effect), and further, (f) a phase-change memory element (PRAM) or a programmable metallization cell (PMC) which is operated as a memory element using the fact that a phase change material forming a resistance change layer has electrical resistance different by several digits between an amorphous state and a crystalline state, and (g) a resistance random access memory (ReRAM) in which a metal oxide is sandwiched by two electrodes and a pulse voltage is applied to the electrodes can be exemplified.

In a case where the resistance change layer is formed of an ion conductor containing metal, specifically, the resistance change layer can be formed of a conductive or semi-conductive thin film (for example, thin film including GeSbTe, GeTe, GeSe, GeS, SiGeTe, and SiGeSbTe) containing at least one kind of element (atom) selected from a group consisting of copper (Cu), silver (Ag), and zinc (Zn), and at least one kind of element (chalcogen) (atom) selected from a group consisting of tellurium (Te), sulfur (S), and selenium (Se). Note that a layered structure of these thin films and thin films made of, for example, Ag, an Ag alloy, Cu, a Cu alloy, Zn, and a Zn alloy may be adopted. Alternatively, it is also possible to adopt a configuration in which a film (rare earth oxide thin film) made of an oxide of at least one kind of rare earth element selected from a group consisting of La, Ce, Pr, Nd, Sm, Eu, Gd, Tb, Dy, Ho, Er, Yb, and Y among rare earth elements, or an oxide film, such as Hf, Ta, and W, is formed on all or some of these thin films in the film thickness direction. Alternatively, it is possible to use a conductive or semi-conductive thin film (for example, an amorphous thin film made of GeSbTeGd) containing at least one kind of element (atom) selected from a group consisting of germanium (Ge), silicon (Si), antimony (Sb), and indium (In) and at least one kind of element (chalcogen) (atom) selected from a group consisting of tellurium (Te), sulfur (S), and selenium (Se).

In a case where the resistance change layer has the layered structure of a high-resistance layer and an ion source layer, specifically, the ion source layer may contain at least one kind of metal element as an element that can be positively ionized, and further contain at least one kind of element (chalcogen) (atom) selected from a group consisting of tellurium (Te), sulfur (S), and selenium (Se) as an element that can be negatively ionized. The metal element and chalcogen are coupled to form a metal chalcogenide layer (chalcogenide-based material layer). The metal chalcogenide layer mainly has an amorphous structure and functions as an ion supply source. Here, the ion source layer is formed to have a lower resistance value than the high-resistance layer in an initial state or erasing state.

The metal element forming the metal chalcogenide layer is preferably a chemically stable element that can be present in a metal state in the ion source layer containing chalcogen described above so as to deoxidized on an electrode during a writing operation to form a conduction path (filament) in the metal state. Examples of such a metal element can include copper (Cu), aluminum (Al), germanium (Ge), and zinc (Zn), and, for example, transition metals of the 4A, 5A, and 6A Groups in the periodic table of the elements, that is, Ti (titanium), Zr (zirconium), Hf (hafnium), V (vanadium), Nb (niobium), Ta (tantalum), Cr (chromium), Mo (molybdenum), and W (tungsten). One kind or two or more kinds of those elements can be used. In addition, Al (aluminum), Cu (copper), Ge (germanium), Si (silicon), or the like may be used as an additive element with respect to the ion source layer.

Specific examples of a constituent material of the ion source layer include ZrTeAl, TiTeAl, CrTeAl, WTeAl, TaTeAl, and CuTe. In addition, for example, CuZrTeAl obtained by adding Cu to ZrTeAl, CuZrTeAlGe obtained by further adding Ge, and CuZrTeAlSiGe obtained by further adding Si as an additive element can also be exemplified. Alternatively, ZrTeMg using Mg, instead of Al, can also be exemplified. Even when another transition metal element, such as titanium (Ti) and tantalum (Ta), is selected as the metal element forming the metal chalcogenide layer, instead of zirconium (Zr), a similar additive element can be used, and specific examples of a constituent material of the ion source layer an also include TaTeAlGe. In addition, sulfur (S), selenium (Se), or iodine (I) may be used other than tellurium (Te), and specific constituent materials of the ion source layer can include ZrSAl, ZrSeAl, ZrIAl, and the like.

Alternatively, when the metal element forming the metal chalcogenide layer is formed of a metal element (M) that easily reacts with tellurium (Te) contained in the high-resistance layer to obtain a layered structure such as a Te/ion source layer (including the metal element M), a stabilized structure such as an M-Te/ion source layer can be obtained by heat treatment after film deposition. Here, examples of the metal element (M) that easily reacts with tellurium (Te) can include aluminum (Al) and magnesium (Mg).

Note that other elements may be added to the ion source layer for the purpose of, for example, preventing the film from being peeled off during high-temperature heat treatment at the time of forming the resistance change layer. For example, silicon (Si) is an additive element also capable of improving a retaining property at the same time, and thus, is preferably added to the ion source layer together with zirconium (Zr), for example. However, it is difficult to expect the effect of preventing the film from being peeled off if the amount of silicon (Si) added is too little, and it is difficult to obtain a favorable memory operation property if the amount is too much. Thus, a content of silicon (Si) in the ion source layer is preferably within a range of approximately 10 to 45 atomic %.

When a predetermined voltage is applied to the nonvolatile memory element, at least one kind of metal element is diffused in the high-resistance layer as an element that can be positively ionized, so that a resistance value of the high-resistance layer is lowered. Thus, the high-resistance layer has a function as a barrier in electric conduction, and has a resistance value higher than that of the ion source layer when a predetermined voltage is applied between an electrode and a conductive material layer (or wiring) in an initial state or erasing state. The high-resistance layer includes a layer made of a compound having tellurium (Te) as a main component, which behaves as a negative ion component, for example, as described above. Specific examples of such a compound include AlTe, MgTe, and ZnTe. Regarding a composition of the compound containing tellurium (Te), a content of aluminum (Al) in AlTe is preferably between 20 atomic % and 60 atomic %, for example. Alternatively, the high-resistance layer may contain an oxide such as aluminum oxide ($AlO_x$). In addition, an initial resistance value of the high-resistance layer is preferably 1 MΩ or more, and a resistance value in a low-resistance state is preferably several 100 kΩ or less. That is, the nonvolatile memory element stores information or the like by changing the resistance value of the high-resistance layer. In order to read a resistance state of a miniaturized nonvolatile memory element at high speed, it is preferable to lower the resistance value in a low-resistance state as much as possible. However, a resistance value is 40 kΩ to 100 kΩ when information (data) or the like is written under conditions of 20 μA to 50 μA and 2 V, and thus, it is a premise that the initial resistance value of the nonvolatile memory element is higher than this value. Further, the above-described resistance value is considered as being appropriate in view of a resistance separation range corresponding to one digit. Note that the high-resistance layer can have not only a single-layer configuration but also a multi-layer configuration. In this case, a lower layer containing tellurium as negative ion components the most is brought into contact with an electrode on the high-resistance layer side and an upper layer contains an element as a negative ion component other than tellurium. Alternatively, examples of the high-resistance layer can also include SiN, $SiO_2$, and $Gd_2O_3$, and also include a material containing fluorine (for example, $MgF_2$, $AlF_3$, $CaF_2$, or LiF).

Here, if the high-resistance layer contains tellurium (Te) as negative ion components the most, a metal element diffused in the high-resistance layer is stabilized when the resistance of the high-resistance layer is lowered, and the low-resistance state is easily retained. On the other hand, tellurium (Te) has a weaker coupling force with the metal element than an oxide or a silicon compound, and the metal element diffused in the high-resistance layer easily moves to the ion source layer, so that an erasing property is improved. That is, a retaining property of write data in the low-resistance state is improved, and the voltage can be reduced during data erasing. In addition, variations in the resistance value in the erasing state can be reduced with respect to multiple writing/erasing operations. Note that, regarding electronegativity, an absolute value generally increases in the order of tellurium<selenium<sulfur<oxygen in a chalcogenide compound. Thus, the effect of improvement is higher as less oxygen is present in the high-resistance layer and chalcogenide having a lower electronegativity is used.

Examples of a material forming the electrode can include W (tungsten), WN (tungsten nitride), Cu (copper), Al (aluminum), Mo (molybdenum), Au (gold), Pt (platinum), Ti (titanium), TiN (titanium nitride), TiW (titanium-tungsten), Mo (molybdenum), Ta (tantalum), and silicide. Note that, when the electrode is made of a material such as copper (Cu) in which ion conduction is likely to occur due to an electrical field, the surface of the electrode may be covered with a material such as tungsten (W), a tungsten nitride (WN), a titanium nitride (TiN), and a tantalum nitride (TaN) in which ion conduction and thermophoresis hardly occur. In addition, when the ion source layer contains Al (aluminum), examples of the material forming the electrode can include a material more hardly ionized than Al (aluminum), for example, a metal film containing at least one kind of Cr (chromium), W (tungsten), Co (cobalt), Si (silicon), Au (gold), Pd (palladium), Mo (molybdenum), Ir (iridium), and Ti (titanium), and an oxide film or nitride film thereof. A known conductive material containing a conductive material similar to the electrode can be used for the conductive material layer (or wiring). Alternatively, a layered structure including an underlayer made of Cr, Ti, or the like, and a Cu layer, an Au layer, a Pt layer, and the like formed thereon may be provided. Further, a single layer such as Ta or a layered structure with Cu, Ti, and the like can also be used. The electrode and the conductive material layer (or wiring) can be formed by, for example, a PVD method or a CVD method exemplified by a sputtering method.

When information is stored (written), a voltage pulse in a "positive direction" (for example, the high-resistance layer is set to have a negative potential and the ion source layer is set to have a positive potential) is applied to the nonvolatile memory element in an initial state (high-resistance state). As a result, the metal element contained in the ion source layer is ionized, diffused in the high-resistance layer, coupled with electrons on an electrode to be precipitated, or remains in the high-resistance layer to form an impurity state. As a result, a conduction path containing the metal element is formed in the information storage layer, more specifically, in the high-resistance layer, and the resistance of the information storage layer decreases (information storage state). Thereafter, even when a voltage is not applied to the nonvolatile memory element, the information storage layer is retained in the low-resistance state. As a result, the information is written and retained. In the case of use in a write-once storage device which is so-called programmable read only memory (PROM), storing (recording) of information is completed only by this information storing process. On the other hand, a rewriting process is required for the application to a storage device capable of rewriting information a plurality of times, that is, a random access memory (RAM), an EEPROM, or the like. When information is rewritten, a voltage pulse in a "negative direction" (for example, the high-resistance layer is set to have a positive potential, and the ion source layer is set to have a negative potential) is applied to the nonvolatile memory element in the low-resistance state. As a result, the metal element precipitated on the electrode is ionized and dissolved in the ion source layer. As a result, the conduction path containing the metal element disappears, and a state where the resistance of the high-resistance layer is high (initial state or erasing state) is obtained. Thereafter, even when a voltage is not applied to the nonvolatile memory element, the information storage layer is retained in the high-resistance state. In this manner, the written information is erased. As such a process is repeated, it is possible to repeat writing of information in the nonvolatile memory element and erasing of the written information. When reading the information stored in the nonvolatile memory element, a voltage in, for example, a "positive direction" (for example, the high-resistance layer is set to have a negative potential and the ion source layer is set to have a positive potential) is applied, but a value thereof is lower than a value of the voltage applied when the information is stored (written). For example, when the high-resistance state is set corresponding to information of "0" and the low-resistance state is set corresponding to information of "1", "0" is changed to "1" in the information writing process, and "1" is changed to "0" in the information erasing process. Note that the operation of forming the low-resistance state and the operation of forming the high-resistance state are respectively set to correspond to the writing operation and the erasing operation, but the erasing operation and the writing operation may be set to correspond to opposite resistance states.

When the resistance change layer is made of a chalcogenide-based material, examples of the chalcogenide-based material include compounds of metal and Se or Te, such as GeSbTe, ZnSe, and GaSnTe.

In addition, when the resistance change layer is made of a material having a Colossal electro-resistance effect (CER effect), examples of such a material can include a 3-element-based perovskite type transition metal oxide ($PrCaMnO_3$ or $SrTiO_3$) and a 2-element-based transition metal oxide (CiO, NiO, CuO, $TiO_2$, or $Fe_3O_4$).

In addition, the resistance change layer is made of a chalcogenide-based material in order to use the phase change material forming the resistance change layer of the phase-change nonvolatile memory element as the memory element by utilizing the fact that the electrical resistance differs by several digits between the amorphous state and the crystalline state. Then, if the resistance change layer is rapidly cooled after a pulsed large current is applied for a short time (for example, 200 microamps for 20 nanoseconds), the phase change material forming the resistance change layer is brought into the amorphous state and exhibits high resistance. On the other hand, when the resistance change layer is slowly cooled after a pulsed small current is applied for a relatively long time (for example, 100 microamps for 100 nanoseconds), the phase change material forming the resistance change layer is brought into the crystalline state and exhibits low resistance.

In addition, the ReRAM is formed of a multi-element-based metal oxide including a plurality of metal elements and oxygen such as a perovskite-type metal oxide or formed of a 2-element-based metal oxide including one kind of metal element and oxygen, and can be of a unipolar (non-polar) type or bipolar type or can also be of a filament type (fuse-antifuse type) or an interface type.

Alternatively, the nonvolatile memory element can include a nonvolatile magnetic memory element having a so-called magnetoresistance effect. Specific examples of such a nonvolatile memory element include a tunnel magnetoresistive effect element of a current magnetization reversal type, and a spin transfer torque-based magnetic random access memory (spin RAM) to which magnetization reversal by spin injection is applied. The latter includes an in-plane magnetization type and a perpendicular magnetization type.

In the nonvolatile memory element in which the inter-electrode material layer is provided such that the electrode reaction inhibition layer is formed or eliminated or the area is increased or decreased, an redox-active substance layer is made of at least one kind selected from a group consisting of nickel (Ni), cobalt (Co), chromium (Cr), titanium (Ti), tantalum (Ta), iron (Fe), aluminum (Al), vanadium (V), a reductant ($H_xWO_3$) of a tungsten oxide ($WO_3$), and an oxide of vanadium (V). In addition, the inter-electrode material layer includes, as a base material, an amorphous thin film containing at least one kind of chalcogenide-based materials, such as sulfur (S), selenium (Se), and tellurium (Te), and at least one kind of germanium (Ge), silicon (Si), antimony (Sb), and indium (In).

Note that the present disclosure can also have the following configurations.

[A1] «Nonvolatile Memory Cell»

A nonvolatile memory cell comprising
a resistance-change nonvolatile memory element and a selection transistor, wherein
one end of the nonvolatile memory element is connected to one source/drain region of the selection transistor and is connected to a write line,
other source/drain region of the selection transistor is connected to a select line, and
another end of the nonvolatile memory element is connected to a bit line.

[A2]

The nonvolatile memory cell according to [A1], wherein the nonvolatile memory element is formed of a spin transfer torque-based magnetic random access memory of a perpendicular magnetization type.

[A3]

The nonvolatile memory cell according to [A2], wherein
the nonvolatile memory element includes at least a storage layer and a magnetization fixed layer, and
the magnetization fixed layer is connected to the one source/drain region of the selection transistor.

[A4]

The nonvolatile memory cell according to any one of [A1] to [A3], wherein
the selection transistor and the write line are provided on a first surface side of a base portion made of a semiconductor material, and
the nonvolatile memory element is provided on a second surface side opposing the first surface of the base portion.

[A5]

The nonvolatile memory cell according to any one of [A1] to [A3], wherein
the selection transistor and the nonvolatile memory element are provided on a first surface side of a base portion made of a semiconductor material, and
the write line is provided on a second surface side opposing the first surface of the base portion.

[A6]

The nonvolatile memory cell according to any one of [A1] to [A5], wherein
the one source/drain region of the selection transistor has a rectification property,
when the selection transistor is not conductive, a current flows between the write line and the nonvolatile memory element via the one source/drain region of the selection transistor, and
when the selection transistor is conductive, a current flows between the select line and the nonvolatile memory element via the one source/drain region and the other source/drain region of the selection transistor, and a current does not flow to the write line.

[A7]

The nonvolatile memory cell according to [A6], wherein the one source/drain region of the selection transistor has a p/n junction.

[A8] «Nonvolatile Memory Cell of First Mode»

The nonvolatile memory cell according to [A7], wherein the one source/drain region of the selection transistor has a layered structure of a first layer made of silicon containing an impurity of a first conductivity type and a second layer made of silicon containing an impurity of a second conductivity type different from the first conductivity type.

[A9] «Nonvolatile Memory Cell of Second Mode»

The nonvolatile memory cell according to [A7], wherein the one source/drain region of the selection transistor has a layered structure of a first layer made of silicon containing an impurity of a first conductivity type and a second layer made of germanium or silicon-germanium containing an impurity of a second conductivity type different from the first conductivity type.

[A10]

The nonvolatile memory cell according to [A6], wherein the one source/drain region of the selection transistor has a Schottky junction.

[A11] «Nonvolatile Memory Cell of Third Mode»

The nonvolatile memory cell according to [A10], wherein the one source/drain region of the selection transistor has a layered structure of a first layer made of silicon containing an impurity and a second layer made of metal.

[A12] «Nonvolatile Memory Cell of Fourth Mode»

The nonvolatile memory cell according to [A10], wherein the one source/drain region of the selection transistor has a layered structure of a first layer made of silicon containing an impurity and a second layer made of germanium or silicon-germanium containing an impurity.

[A13]

The nonvolatile memory cell according to any one of [A1] to [A12], wherein the selection transistor is formed of a field effect transistor.

[A14]

The nonvolatile memory cell according to any one of [A1] to [A12], wherein the selection transistor includes a FinFET.

[B1] «Nonvolatile Memory Cell Array»

A nonvolatile memory cell array comprising
a plurality of nonvolatile memory cells arranged in a two-dimensional matrix in a first direction and a second direction different from the first direction, wherein
each of the plurality of nonvolatile memory cells arranged along the first direction includes
a resistance-change nonvolatile memory element and a selection transistor,
one end of the nonvolatile memory element is connected to one source/drain region of the selection transistor and is connected to a write line common to the plurality of nonvolatile memory cells arranged along the first direction, other source/drain region of the selection transistor is connected to a select line common to the plurality of nonvolatile memory cells arranged along the first direction, and another end of the nonvolatile memory element is connected to a bit line common to the plurality of nonvolatile memory cells arranged along the first direction.

[B2]

The nonvolatile memory cell array according to [A15], wherein a gate electrode of the selection transistor is connected to a word line extending in the second direction.

[C1] «Information Writing Method of Nonvolatile Memory Cell Array»

An information writing method of a nonvolatile memory cell array including a plurality of nonvolatile memory cells arranged in a two-dimensional matrix in a first direction and a second direction different from the first direction, each of the plurality of nonvolatile memory cells arranged along the first direction including a resistance-change nonvolatile memory element and a selection transistor, one end of the nonvolatile memory element being connected to one source/drain region of the selection transistor and connected to a write line common to the plurality of nonvolatile memory cells arranged along the first direction, other source/drain region of the selection transistor being connected to a select line common to the plurality of nonvolatile memory cells arranged along the first direction, another end of the nonvolatile memory element being connected to a bit line common to the plurality of nonvolatile memory cells arranged along the first direction, the information writing method of the nonvolatile memory cell array comprising steps of bringing the selection transistor into a non-conductive state and causing a current to flow between the write line and the nonvolatile memory element to store information "1" in each of the nonvolatile memory cells, in each of the plurality of nonvolatile memory cells arranged along the first direction; and bringing the write line into a floating state, bringing a desired selection transistor into a conductive state, and causing a current to flow between the select line and the nonvolatile memory element via other source/drain region and one source/drain region of the desired selection transistor to store information "0" in the nonvolatile memory cell.

REFERENCE SIGNS LIST 10, 60 BASE PORTION
10A FIRST SURFACE OF BASE PORTION
10B SECOND SURFACE OF BASE PORTION
11 ELEMENT ISOLATION REGION
12, 62 GATE ELECTRODE
13, 63 GATE INSULATING LAYER
14, 64 CHANNEL FORMATION REGION
15A, 65A ONE SOURCE/DRAIN REGION OF SELECTION TRANSISTOR
15B, 65B OTHER SOURCE/DRAIN REGION OF SELECTION TRANSISTOR
$15A_1$ FIRST LAYER
$15A_2$, $15A_3$, $15A_4$ SECOND LAYER
16 GATE SIDEWALL
17a, 17b SILICON LAYER
21 LOWER INSULATING LAYER
22, 23, 26 CONNECTION HOLE
22A, 23A, 26A BARRIER METAL LAYER
24 CONTACT PORTION
25 UPPER INSULATING LAYER
31 INTERLAYER INSULATING LAYER
32 CONNECTION HOLE
32A BARRIER METAL LAYER
33 INSULATING LAYER
41 UNDERLAYER
42 CONNECTING PORTION
50 NONVOLATILE MEMORY ELEMENT
50A LAYERED STRUCTURE BODY
50a FIRST SURFACE OF LAYERED STRUCTURE BODY
50b SECOND SURFACE OF LAYERED STRUCTURE BODY
51 MAGNETIZATION FIXED LAYER
52 INTERMEDIATE LAYER
53 STORAGE LAYER
54 CAP LAYER
TR SELECTION TRANSISTOR
WR WRITE LINE
BL BIT LINE
SL SELECT LINE
WL WORD LINE

The invention claimed is:

1. A nonvolatile memory cell comprising:
a resistance-change nonvolatile memory element and a selection transistor, wherein
one end of the nonvolatile memory element is connected to one source/drain region of the selection transistor and is connected to a write line,
other source/drain region of the selection transistor is connected to a select line,
another end of the nonvolatile memory element is connected to a bit line,
the selection transistor and the write line are provided on a first surface side of a base portion made of a semiconductor material, and
the nonvolatile memory element is provided on a second surface side opposing the first surface of the base portion.

2. The nonvolatile memory cell according to claim 1, wherein the nonvolatile memory element is formed of a spin transfer torque-based magnetic random access memory of a perpendicular magnetization type.

3. The nonvolatile memory cell according to claim 2, wherein
the nonvolatile memory element includes at least a storage layer and a magnetization fixed layer, and
the magnetization fixed layer is connected to the one source/drain region of the selection transistor.

4. The nonvolatile memory cell according to claim 1, wherein the selection transistor is formed of a field effect transistor.

5. The nonvolatile memory cell according to claim 1, wherein the selection transistor includes a Fin-FET.

6. A nonvolatile memory cell array comprising:
a plurality of nonvolatile memory cells according to claim 1, each one of the plurality of nonvolatile memory cells arranged in a two-dimensional matrix in a first direction and a second direction different from the first direction, wherein
the write line is common to the plurality of nonvolatile memory cells arranged along the first direction, the select line is common to the plurality of nonvolatile memory cells arranged along the first direction, and the bit line is common to the plurality of nonvolatile memory cells arranged along the first direction.

7. The nonvolatile memory cell array according to claim 6, wherein a gate electrode of the selection transistor is connected to a word line extending in the second direction.

8. A nonvolatile memory cell comprising:
a resistance-change nonvolatile memory element and a selection transistor, wherein
one end of the nonvolatile memory element is connected to one source/drain region of the selection transistor and is connected to a write line,
other source/drain region of the selection transistor is connected to a select line,
another end of the nonvolatile memory element is connected to a bit line,
the selection transistor and the nonvolatile memory element are provided on a first surface side of a base portion made of a semiconductor material, and
the write line is provided on a second surface side opposing the first surface of the base portion.

9. A nonvolatile memory cell comprising:
a resistance-change nonvolatile memory element and a selection transistor, wherein
one end of the nonvolatile memory element is connected to one source/drain region of the selection transistor and is connected to a write line,
other source/drain region of the selection transistor is connected to a select line,
another end of the nonvolatile memory element is connected to a bit line,
the one source/drain region of the selection transistor has a rectification property,
when the selection transistor is not conductive, a current flows between the write line and the nonvolatile memory element via the one source/drain region of the selection transistor, and
when the selection transistor is conductive, a current flows between the select line and the nonvolatile memory element via the one source/drain region and the other source/drain region of the selection transistor, and a current does not flow to the write line.

10. The nonvolatile memory cell according to claim 9, wherein the one source/drain region of the selection transistor has a p/n junction.

11. The nonvolatile memory cell according to claim 10, wherein the one source/drain region of the selection transistor has a layered structure of a first layer made of silicon containing an impurity of a first conductivity type and a second layer made of silicon containing an impurity of a second conductivity type different from the first conductivity type.

12. The nonvolatile memory cell according to claim 10, wherein the one source/drain region of the selection transistor has a layered structure of a first layer made of silicon containing an impurity of a first conductivity type and a second layer made of germanium or silicon-germanium containing an impurity of a second conductivity type different from the first conductivity type.

13. The nonvolatile memory cell according to claim 9, wherein the one source/drain region of the selection transistor has a Schottky junction.

14. The nonvolatile memory cell according to claim 13, wherein the one source/drain region of the selection transistor has a layered structure of a first layer made of silicon containing an impurity and a second layer made of metal.

15. The nonvolatile memory cell according to claim 13, wherein the one source/drain region of the selection transistor has a layered structure of a first layer made of silicon containing an impurity and a second layer made of germanium or silicon-germanium containing an impurity.

16. An information writing method of a nonvolatile memory cell array including a plurality of nonvolatile memory cells arranged in a two-dimensional matrix in a first direction and a second direction different from the first direction,
each of the plurality of nonvolatile memory cells arranged along the first direction including:
a resistance-change nonvolatile memory element and a selection transistor,
one end of the nonvolatile memory element being connected to one source/drain region of the selection transistor and connected to a write line common to the plurality of nonvolatile memory cells arranged along the first direction,
other source/drain region of the selection transistor being connected to a select line common to the plurality of nonvolatile memory cells arranged along the first direction, and
another end of the nonvolatile memory element being connected to a bit line common to the plurality of nonvolatile memory cells arranged along the first direction, the information writing method of the nonvolatile memory cell array comprising:
bringing the selection transistor into a non-conductive state and causing a current to flow between the write line and the nonvolatile memory element to store information "1" in each of the nonvolatile memory cells in each of the plurality of nonvolatile memory cells arranged along the first direction; and
bringing the write line into a floating state, bringing a desired selection transistor into a conductive state, and causing a current to flow between the select line and the nonvolatile memory element via other source/drain region and one source/drain region of the desired selection transistor to store information "0" in the nonvolatile memory cell.

* * * * *